US012633942B2

(12) United States Patent
Pan

(10) Patent No.: US 12,633,942 B2
(45) Date of Patent: May 19, 2026

(54) ENCODING METHOD, ENCODER AND DATA TRANSMISSION SYSTEM

(71) Applicant: Huawei Technologies Co., Ltd., Shenzhen (CN)

(72) Inventor: Chunpo Pan, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 13 days.

(21) Appl. No.: 18/790,695

(22) Filed: Jul. 31, 2024

(65) Prior Publication Data

US 2025/0240034 A1 Jul. 24, 2025

Related U.S. Application Data

(60) Provisional application No. 63/624,608, filed on Jan. 24, 2024.

(51) Int. Cl.
H03M 13/05 (2006.01)
H04L 1/00 (2006.01)

(52) U.S. Cl.
CPC .......... H03M 13/05 (2013.01); H04L 1/0041 (2013.01); H04L 1/0045 (2013.01); H04L 1/0057 (2013.01)

(58) Field of Classification Search
CPC ............... H03M 13/05; H03M 13/152; H03M 13/2906; H03M 13/2957; H03M 13/1102; H04L 1/0041; H04L 1/0045; H04L 1/0057; H04L 1/0061; H04L 1/0064
See application file for complete search history.

(56) References Cited

U.S. PATENT DOCUMENTS 11,683,125 B2 * 6/2023 Ye ..................... H03M 13/2906
714/755
2009/0158112 A1 6/2009 Oh et al.
(Continued)

FOREIGN PATENT DOCUMENTS

WO 2014117836 A1 8/2014
WO 2017178264 A1 10/2017

OTHER PUBLICATIONS

Cideciyan et al., "Product Codes for Data Storage on Magnetic Tape," IEEE Transactions on Magnetics, vol. 53, No. 2, Feb. 2017, 10 pages.

(Continued)

*Primary Examiner* — Shelly A Chase
(74) *Attorney, Agent, or Firm* — Slater Matsil, LLP

(57) ABSTRACT

An encoding method, applied to the field of encoding technologies, may be used for reducing the delay and reducing the decoding memory, and includes: obtaining a data signal including a plurality of information bits; and performing encoding process on the data signal to obtain an encoded signal. An encoding block in the encoded signal includes a first encoding sub-block and at least one second encoding sub-block. The first encoding sub-block includes first component codewords and second component codewords, and all information bits constitute an information bit matrix. Each second encoding sub-block includes a first check matrix, which includes first check bit sets each determined based on bits of a first bit matrix with same side lengths, and the first check bit set and the bits of the first bit matrix constitute a third component codeword.

20 Claims, 9 Drawing Sheets

301

(56) References Cited

U.S. PATENT DOCUMENTS

| | | | | |
|---|---|---|---|---|
| 2020/0136650 A1* | 4/2020 | Huang | .............. | H03M 13/2906 |
| 2021/0111737 A1* | 4/2021 | Shin | .................. | H03M 13/1102 |

OTHER PUBLICATIONS

Thomas Mittelholzer, "Performance Analysis of Iteratively Decoded 3-Dimensional Product Codes," 2018 IEEE International Symposium on Information Theory (ISIT), doi: 10.1109/ISIT.2018. 8437938, Jun. 17-22, 2018, 5 pages.
Shehadeh et al., "Generalized Staircase Codes with Arbitrary Bit Degree," Optical Fiber Communication Conference (OFC) 2024, Technical Digest Series, Feb. 2024, paper W4C.2, https://opg.optica. org/abstract.cfm?URI=OFC-2024-W4C.2, 3 pages.

* cited by examiner information bits $P$ bits          $(n-P)$ bits parity bits

Height direction

Width direction

Length direction

| | 3D product 1 | 3D product 2 | Gen. SC. | SC. |
|---|---|---|---|---|
| OH | 6.7% | 6.7% | 6.7% | 6.7% |
| GF size | 1024 | 1024 | 1024 | 1024 |
| S | 499 | 953 | 197 | N/A |
| t | 1 | 2 | 1 | 3 |
| DEC Mem. | 266 Kbits | 969 Kbits | 1.15Mbits | 1.3 Mbits |
| BER_th | 3.3e-3 | 3.32e-3 | 3.25e-3 | 4.5e-3 |

ENCODING METHOD, ENCODER AND DATA TRANSMISSION SYSTEM

CROSS-REFERENCE TO RELATED APPLICATION

This application claims the priority to U.S. Provisional Application No. 63/624,608, filed on Jan. 24, 2024, the disclosure of which is incorporated, in its entirety, by reference.

TECHNICAL FIELD

The present disclosure relates to the field of encoding technologies, and in particular, to an encoding method, an encoder and a data transmission system.

BACKGROUND

Due to noise and other factors, inevitable transmission errors may occur during data transmission. In order to reduce transmission errors, the data transmitter may employ the forward error correction (FEC) technology to encode data to be transmitted. FEC is an error control technology, and is capable of correcting and recovering data when errors occur during the data transmission. Through the FEC technology, the transmission errors are reduced and the reliability of data transmission is improved.

In some application scenarios, especially in communication systems with high throughput (e.g., short-reach systems, such as data center interconnect (DCI) links), low delay and low decoding memory are important performances in selection of an encoding scheme.

SUMMARY

The present disclosure provides an encoding method, an encoder and a data transmission system, which may reduce the delay and reduce the decoding memory.

In an aspect, an encoding method is provided, which is applied to an encoder, circuits in the encoder, a chip, or a chip system. The method includes: obtaining a data signal, the data signal including a plurality of information bits; and performing an encoding process on the data signal to obtain an encoded signal. The encoded signal includes at least one encoding block, and an encoding block includes a first encoding sub-block and at least one second encoding sub-block. The first encoding sub-block includes a plurality of first component codewords and a plurality of second component codewords, a first component codeword and a second component codeword both include one or more information bits of the plurality of information bits and one or more check bits, and all information bits in the plurality of first component codewords and the plurality of second component codewords constitute an information bit matrix. Each second encoding sub-block includes a first check matrix; the first check matrix includes a plurality of first check bit sets each including one or more check bits, the first check bit set is determined based on bits of a first bit matrix with same side lengths, and the first check bit set and the bits of the first bit matrix constitute a third component codeword. The first bit matrix includes any one of: part or all of information bits of the plurality of information bits, part or all of check bits in the plurality of first component codewords, or part or all of check bits in the plurality of second component codewords.

In the foregoing method, a second encoding sub-block is added to the encoding block to extend protection for at least part of the information bits. Since at least part of the information bits are protected by more than two component codes in the two-dimensional space (that is, the bit degree of the at least part of information bits are greater than 2), the number of check bits in the component code is allowed to be relatively small. Compared with the three-dimensional product code, the encoding method of the embodiments of the present disclosure may have smaller decoding memory (less than 1.8 Mbits), lower power consumption and lower delay. In addition, the decoding buffer size may be implemented in optical communication. In addition, since the encoded signal has the block code structure in the two-dimensional space, compared with the encoding method using the convolutional code such as a staircase code or a generalized staircase code, the encoding method of the embodiments of the present disclosure may be suitable for applications that adopt the block code.

In some embodiments, no two bits in the first bit matrix share same two third component codewords. In this way, the bits in the first bit matrix may be protected evenly.

In some embodiments, the bits from the first bit matrix in the third component codeword are located in different rows and different columns of the first bit matrix. In this way, the bits in the first bit matrix may be protected without redundancy protection.

In some embodiments, bits from the first bit matrix included in any two third component codewords are in different positions of the first bit matrix. In this way, the bits in the first bit matrix may be protected evenly.

In some embodiments, the first encoding sub-block has same side lengths, and the side length of the first bit matrix is less than or equal to the side length of the first encoding sub-block; or the first encoding sub-block has different side lengths, and the side length of the first bit matrix is less than or equal to a minimum side length of the first encoding sub-block. In this way, the side length of the first bit matrix may be determined according to actual bits to be protected, thereby realizing protection on demand, which may reduce check bits, and reduce the decoding memory, power consumption and delay.

In some embodiments, the first bit matrix is the information bit matrix or the first encoding sub-block.

In some embodiments, the third component codeword includes bits in a row or column selected from a second bit matrix, and the second bit matrix is determined based on the first bit matrix and an invertible transformation matrix. In this way, the process of determining the first check bit set based on the second bit matrix may be simplified.

In some embodiments, bits in different third component codewords are bits in a row or column selected from different second bit matrices.

In some embodiments, bits in different third component codewords are bits from different second encoding sub-blocks.

In some embodiments, the second encoding sub-block further includes a second check matrix, the second check matrix is used to correct errors in check bits of the first check matrix. In this way, through the second check matrix, the encoded signal by the encoding method in the embodiments of the present disclosure may have multiple error verification, which may improve the reliability of data transmission.

In some embodiments, the second check matrix comprises a plurality of second check bit sets, each second check bit set includes one or more check bits, and the second check bit set is determined based on a plurality of check bits of the first check matrix.

In some embodiments, the at least one second encoding sub-block and the first encoding sub-block are in a same column but in different rows, and the first check matrix and the second check matrix are in a same row but in different columns; and the second check matrix includes a plurality of second check bit sets each including one or more check bits, and the second check bit set is determined based on a row of check bits in the first check matrix, and check bits in the row of check bits are located in the plurality of first check bit sets.

In some embodiments, the at least one second encoding sub-block includes a plurality of second encoding sub-blocks, and the plurality of second encoding sub-blocks are located on a same side or on opposite sides of the first encoding sub-block. In this way, due to the plurality of second encoding sub-blocks, the encoding block may have dimensions greater than 3, and the bit degree of at least part of the information bits may also be greater than 3. Therefore, the encoding block may have higher error correction capability, and the encoding complexity and amount of overhead (OH) of each component code may be reduced, thereby reducing decoding memory required for the corresponding decoding stage. As a result, the encoding block may have not only the good error correction capability but also the performance of low component code complexity and low decoding memory of OH.

In some embodiments, the at least one second encoding sub-block and the first encoding sub-block are in a same row but in different columns, and the first check matrix and the second check matrix are in a same column but in different rows; and the second check matrix includes a plurality of second check bit sets each including one or more check bits, and the second check bit set is determined based on a column of check bits in the first check matrix, and check bits in the column of check bits are located in the plurality of first check bit sets.

In some embodiments, the first encoding sub-block includes the information bit matrix, a row check matrix, a column check matrix and a double check matrix; the row check matrix and the information bit matrix are in a same row but in different columns, and the column check matrix and the information bit matrix are in a same column but in different rows. The row check matrix and the column check matrix are used to correct errors in the information bit matrix, and the double check matrix is used to correct errors in the row check matrix and the column check matrix.

In some embodiments, the first component code includes a check bit of a first encoding, the second component code includes a check bit of a second encoding, the third component code includes a check bit of a third encoding. The first encoding, the second encoding and the third encoding each are one of a Hamming code, a 2-error-correcting BCH code, or a 3-error-correcting BCH code.

In another aspect, an encoder is provided. The encoder includes an interface circuit and a processor. The interface circuit is configured to obtain a data signal, the data signal including a plurality of information bits. The processor is configured to perform an encoding process on the data signal to obtain an encoded signal. The encoded signal includes at least one encoding block, and an encoding block includes a first encoding sub-block and at least one second encoding sub-block. The first encoding sub-block includes a plurality of first component codewords and a plurality of second component codewords; a first component codeword and a second component codeword both include one or more information bits of the plurality of information bits and one or more check bits, and all information bits in the plurality of first component codewords and the plurality of second component codewords constitute an information bit matrix. Each second encoding sub-block includes a first check matrix; the first check matrix includes a plurality of first check bit sets each including one or more check bits, the first check bit set is determined based on bits of a first bit matrix with same side lengths, and the first check bit set and the bits of the first bit matrix constitute a third component codeword. The first bit matrix includes any one of part or all of information bits of the plurality of information bits, part or of all check bits in the plurality of first component codewords, or part or of all check bits in the plurality of second component codewords.

In some embodiments, no two bits in the first bit matrix share same two third component codewords.

In some embodiments, the bits from the first bit matrix in the third component codeword are located in different rows and different columns of the first bit matrix. In this way, the bits in the first bit matrix may be protected without redundancy protection.

In some embodiments, bits from the first bit matrix included in any two third component codewords are in different positions of the first bit matrix.

In some embodiments, the first encoding sub-block has same side lengths, and the side length of the first bit matrix is less than or equal to the side length of the first encoding sub-block; or the first encoding sub-block has different side lengths, and the side length of the first bit matrix is less than or equal to a minimum side length of the first encoding sub-block.

In some embodiments, the first bit matrix is the information bit matrix or the first encoding sub-block.

In some embodiments, the bits are bits in a row or column selected from a second bit matrix, and the second bit matrix is determined based on the first bit matrix and an invertible transformation matrix.

In some embodiments, bits in different third component codewords are bits in a row or column selected from different second bit matrices.

In some embodiments, bits in different third component codewords are bits from different second encoding sub-blocks.

In some embodiments, the second encoding sub-block further includes a second check matrix, and the second check matrix is used to correct errors in check bits of the first check matrix.

In some embodiments, the second check matrix includes a plurality of second check bit sets, each second check bit set includes one or more check bits, and the second check bit set is determined based on a plurality of check bits of the first check matrix.

In some embodiments, the at least one second encoding sub-block and the first encoding sub-block are in a same column but in different rows, and the first check matrix and the second check matrix are in a same row but in different columns; and the second check matrix includes a plurality of second check bit sets each including one or more check bits, the second check bit set is determined based on a row of check bits in the first check matrix, and check bits in the row of check bits are located in the plurality of first check bit sets.

In some embodiments, the at least one second encoding sub-block and the first encoding sub-block are in a same row but in different columns, and the first check matrix and the second check matrix are in a same column but in different rows; and the second check matrix includes a plurality of second check bit sets each including one or more check bits, and the second check bit set is determined based on a column of check bits in the first check matrix, and check bits in the column of check bits are located in the plurality of first check bit sets.

In some embodiments, the at least one second encoding sub-block includes a plurality of second encoding sub-blocks, and the plurality of second encoding sub-blocks are located on a same side or on opposite sides of the first encoding sub-block.

In some embodiments, the first encoding sub-block includes the information bit matrix, a row check matrix, a column check matrix and a double check matrix; the row check matrix and the information bit matrix are in a same row but in different columns, and the column check matrix and the information bit matrix are in a same column but in different rows. The row check matrix and the column check matrix are used to correct errors in the information bit matrix, and the double check matrix is used to correct errors in the row check matrix and the column check matrix.

In some embodiments, the first component code includes a check bit of a first encoding, the second component code includes a check bit of a second encoding, the third component code includes a check bit of a third encoding. The first encoding, the second encoding and the third encoding each are one of a Hamming code, a 2-error-correcting BCH code, or a 3-error-correcting BCH code.

In some embodiments, the encoder may be a chip or a chip system. For example, in a case where the encoder is a chip system, it may include a chip, or may include a chip and other discrete devices.

In yet another aspect, a data transmission system is provided. The data transmission system includes a transmitter and a receiver. The transmitter includes the encoder as described in any of the above embodiments in the another aspect. The transmitter is configured to transmit the encoded signal. The receiver is coupled to the transmitter. The receiver includes a decoder, and the receiver is configured to receive the encoded signal and use the decoder to decode the encoded signal.

In some embodiments, the decoder is configured to decode each encoding block of the encoded signal in parallel.

In some embodiments, the decoder is a hard decoder or soft decoder.

In yet another aspect, a non-transitory computer-readable storage medium is provided. The non-transitory computer-readable storage medium stores instructions that, when executed by a computer, causes the computer to perform the encoding method as described in any of the above embodiments in the aspect.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings.

DETAILED DESCRIPTION OF THE EMBODIMENTS

In order to understand the embodiments of the present disclosure more clearly, some terms or technologies involved in the embodiments of the present disclosure are described below.

1. Forward Error Correction (FEC)

FEC, also known as forward error correction encoding technology, is an error detection and correction technology. FEC is widely used in data transmission systems such as computer storage systems and communication systems to ensure the accuracy of data transmission. The basic principle of FEC is to encode data into codewords with a certain length at the transmitter side, and these codewords contain data and some additional redundant information. During the data transmission, even if an error occurs, the error can be detected and corrected at the receiver side through the redundant information. In this way, the bit error rate (BER) of data can be reduced, the reliability of the data transmission can be improved, and the reliability of the system can be improved.

FEC encoding types include, but are not limited to, Hamming code and Bose-Chaudhuri-Hocquenghem (BCH) code. The Hamming code is a relatively simple error correction code that can detect and correct a bit error of a single information bit. The BCH code can process bit errors of multiple information bits. The bit error may refer to an information bit that is corrupted by noise or other impairments, resulting in a different bit value as detected at the receiver than the corresponding bit value set by the transmitter. The "2-error-correcting BCH (BCH2)" described herein refers to the BCH code with 2-bit error correction capability, and "3-error-correcting BCH (BCH3)" described herein refers to the BCH code with 3-bit error correction capability.

2. Information Bit

Information bit, also known as data bit, is used to carry valid data information (i.e., payload data). The information bit is from the client. The opposite of the information bit is the non-information bit (i.e., check bit or redundant bit), which is used to perform FEC decoding, error detection and error correction. The check bit is generated by encoding.

3. Systematic Code

Figure 1:
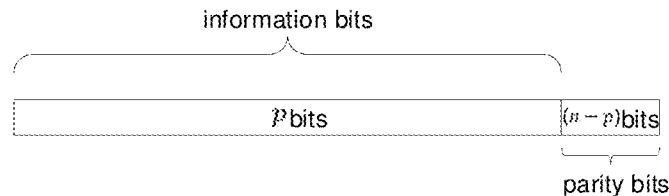
FIG. 1 is a schematic diagram of a systematic code, in accordance with some embodiments of the present disclosure.

Systematic code is a specific implementation of FEC technology. Systematic codewords include encoded bits. The encoded bits may be information bits or check bits. In the systematic code, as shown in FIG. 1, information bits are part of encoded bits, and check bits are another part of the encoded bits. Check bits (non-information bits) are called parity bits. For example, as shown in FIG. 1, the information bits are p bits, the parity bits are (n-p) bits, and the total number of the encoded bits are n bits.

4. Block Code

Block code is an encoding structure of data in block units and block codeword is an organization way of encoded bits in FEC technology. All the encoded bits in the encoded data may be divided into multiple blocks. Each block includes encoded bits. The encoded bits may be information bits or check bits. In each block, one part of the encoded bits are information bits, another part of the encoded bits are check bits. The encoding and decoding of the block codeword are discrete. That is, each block codeword is processed independently, and the bits in one block codeword are not determined based on the bits in other block codewords. That is to say, check bits in one block codeword are determined based on information bits in the block codeword, and are not determined based on information bits in other block codewords. For a systematic block codeword, the parity bits in one block codeword are independent to the information bits in another block codeword.

The systematic code and the systematic block code have the same meaning and thus may be used interchangeably, and the systematic codeword and the systematic block codeword have the same meaning and thus may be used interchangeably.

5. Two-Dimensional Product Code

Two-dimensional product code is a block code, and a two-dimensional product codeword organizes encoded bits into a rectangular array, consisting of rows and columns. Each row includes information bits and check bits, and constitutes a row codeword. Each column includes information bits and check bits, and constitutes a column codeword. In the two-dimensional product codeword, each information bit is part of both a row codeword (a sequence of encoded bits of each row constitutes the row codeword) and a column codeword (a sequence of encoded bits of each column constitutes the column codeword). In other words, each information bit may be within both a row codeword and a column codeword.

6. Component Code

Component code is a type of encoding structure, while a component codeword is a bit sequence that satisfies the encoding structure. A component code defines a codebook, which consists of a collection of all valid component codewords. The component codeword consists of information bits and check bit(s). In the above two-dimensional product codeword, the row codeword and the column codeword are also called component codewords. In other words, the row codeword is also called a row component codeword, and the column codeword is also called a column component codeword. Different component codes may or may not be the same.

7. Bit Degree

Bit degree refers to the number of component codes to which a bit belongs, i.e., the number of component codes used for protecting the bit. The higher the bit degree, the stronger the error correction capability of the system and the higher the reliability of data transmission. For example, each information bit of the two-dimensional product code is protected by a row component code and a column component code, hence the bit degree of the information bits of the two-dimensional product code is 2.

Technical solutions in embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Note that the expression "at least one of A or B" is interchangeable with the expression "A and/or B". It refers to a list in which you may select A or B or both A and B. Similarly, "at least one of A, B, or C", as used herein, is interchangeable with "A and/or B and/or C" or "A, B, and/or C". It refers to a list in which you may select: A or B or C, or both A and B, or both A and C, or both B and C, or all of A, B and C. The same principle applies for longer lists having a same format.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

In addition, the phrase "based on" as used herein is meant to be open and inclusive, since a process, step, calculation or other action that is "based on" one or more of the stated conditions or values may, in practice, be based on additional conditions or value exceeding those stated.

Figure 2:
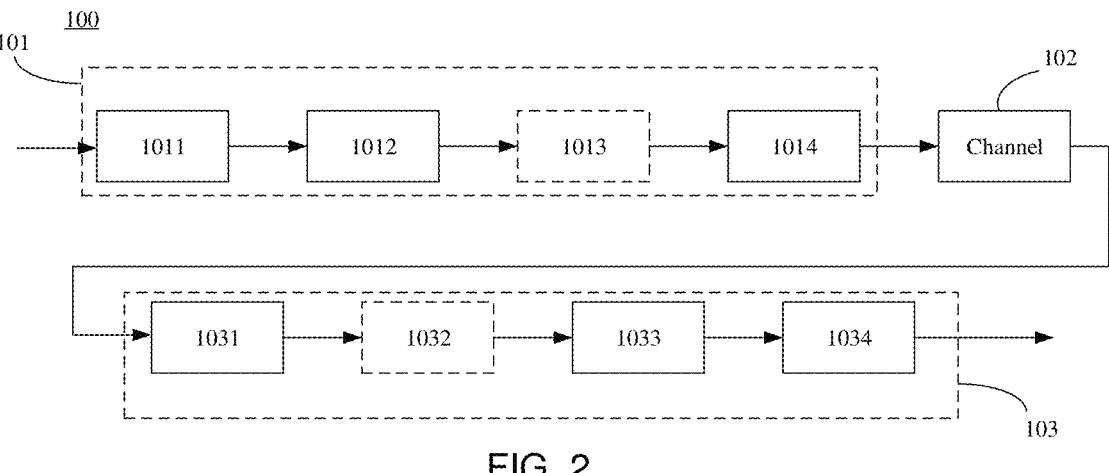
FIG. 2 is a schematic diagram of an optical communication system, in accordance with some embodiments of the present disclosure.

FIG. 2 illustrates a simplified block diagram of an optical communication system 100 using FEC. It should be understood that the present disclosure is not limited to photonic or optical communication, but may also be used for FEC in an electrical, radio frequency, or other wired or wireless digital communication systems.

The transmitter 101 transmits an optical signal through an optical channel 102 such as a fiber-optic channel, and the receiver 103 receives the optical signal after it has passed through the optical channel. The transmitter or receiver may be any type of transmitter or receiver using FEC. By using FEC, a very low error probability can be achieved, e.g., a bit error rate (BER) of below 1e-15 in some implementations. BER is defined as the ratio between the number of error bits and the total number of bits.

The transmitter 101 may be a terminal, a network device, or any other device with encoding capabilities. The receiver 103 may be a terminal, a network device, or any other device with decoding capabilities.

In optical communication systems, a common way to measure performance of a FEC is its (i.e., the decoder's) input BER threshold, which is typically defined as the maximum input BER for the output BER to be below 1e-15. That is to say, the input BER threshold is typically defined as maximum pre-decoding BER that makes post-decoding BER below 1e-15. Given a certain target input BER threshold, an efficient FEC would try to use the minimum amount of overhead (OH) to correct the target number errors.

At the transmitter 101, a digital data signal including a plurality of information bits goes through the FEC encoder 1011 to generate an encoded signal. The encoded signal includes a plurality of encoded bits. Each encoded bit may be an information bit or check bit. The total number (represented as n) of encoded bits in the encoded signal is typically greater than the total number (represented as p) of information bits in the digital data signal, i.e., n>p. The quantity (n−p)/p is called the overhead (OH) of the FEC, while the quantity r=p/n is called the code rate of the FEC. The encoded signal is then received by the mapping and pulse shaping module 1012. The mapping and pulse shaping module 1012 translates the encoded bits of the encoded signal into discrete constellation points according to some constellation label design; and then the mapping and pulse shaping module 1012 converts the constellation points to digital pulses according to some pre-defined pulse-shaping function, thereby generating a digital electrical signal. The pre-equalizer 1013 is an optional device that compensates for some of the channel distortions before the digital electrical signal gets modulated into an analog optical signal by the modulation module 1014. After the digital electrical signal goes through the pre-equalizer 1013, the equalized digital electrical signal is generated. The equalized digital electrical signal is then modulated by the modulation module 1014 into an analog optical signal.

At the receiver 103, the received analog optical signal is demodulated into a digital electrical signal by the demodulation module 1031, and then the digital electrical signal is equalized by the post-equalizer 1032 to generate an equalized digital electrical signal, which compensates for the most of the remaining channel distortions. However, the post-equalizer 1032 cannot compensate for any noise introduced by the optical channel. The demapping module 1033 then translates the equalized digital electrical signal back to a bit sequence, which is equivalent to encoded bits with errors introduced from the optical channel 102. Finally, the FEC decoder 1034 is used to correct most of the errors in the bit sequence and generate recovered information bits. In some embodiments, the probability for a recovered information bit to be erroneous is designed to be lower than 1e-15.

According to different application scenarios, the FEC encoder can use different encoding schemes, and the FEC decoder can use corresponding decoding schemes.

Currently, a concatenated forward error correction (CFEC) encoding scheme is used in the 400 ZR standard, which consists of an inner soft Hamming code and an outer hard staircase code. The staircase code is a convolutional code with a component code of BCH3. Due to its convolutional nature, decoding memory of the staircase code is large (about 1.8 Mbits).

Figure 3:
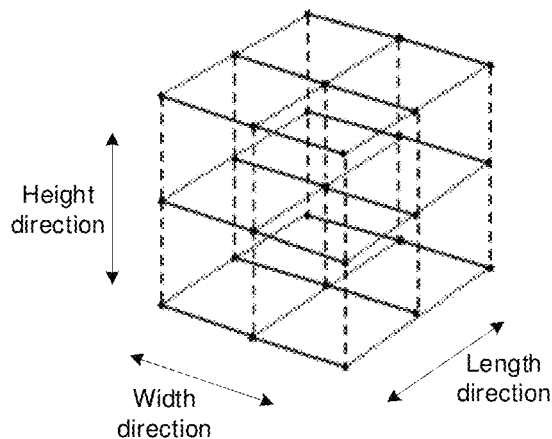
FIG. 3 is a schematic diagram of a three-dimensional product code.

In addition, as shown in FIG. 3, in other application scenarios, a three-dimensional product code encoding scheme is employed, which is a block code architecture. In the three-dimensional product code, encoded bits are arranged in a three-dimensional cube. The three-dimensional cube has dimensions in the length direction, width direction and height direction, and a row of bits in each dimension forms a component code codeword. Each information bit is protected by a component code in the length direction, a component code in the width direction, and a component code in the height direction, hence each information bit in this architecture has a bit degree greater than 2 (the bit degree is 3). For the information bits with higher bit degree, a correction code with weaker error-correcting capability, such as the Hamming code or BCH2 code, may be used to determine check bits in the component code where the information bits are located (when the bit degree is 2, the correction code with weaker error-correcting capability will cause error flare). However, although the three-dimensional product code is a block code, since its block length is proportional to the third power of the component code length, which leads to an unacceptably large decoding memory for OH, close to the decoding memory of the staircase code in CFEC. The block length of the block code is the number of encoded bits within the block code, and the component code length is the number of encoded bits within the component code.

Figure 4:
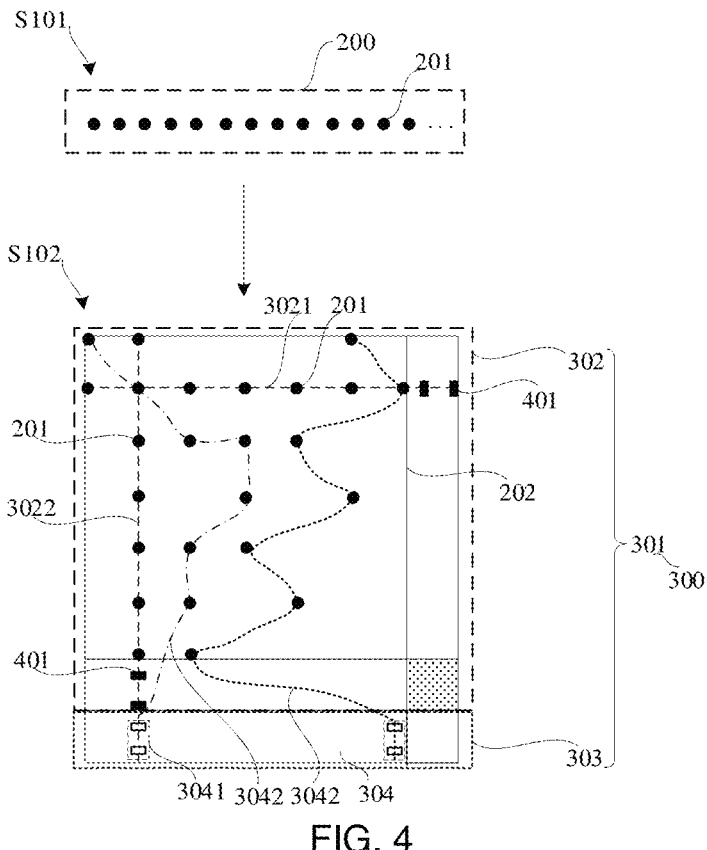
FIG. 4 is a schematic diagram of an encoding method, in accordance with some embodiments of the present disclosure.

Based on this, in order to reduce delay and reduce decoding memory, embodiments of the present disclosure provide an encoding method applied to an encoder (e.g., a FEC encoder), circuits in the encoder, a ship, or a chip system. As shown in FIG. 4, the encoding method includes the following steps.

In step 101, a data signal 200 is obtained, which includes a plurality of information bits 201. It is assumed that the number of information bits 201 within the data signal 200 is M, where M is an integer greater than 0.

The data signal is a digital signal, which is discrete and represented in digital form. Each information bit in the data signal is a binary bit. Each binary bit represents an information unit, which is typically 0 or 1.

In some embodiments, the step 101 includes: receiving a data signal 200. For example, the encoder may receive the data signal 200 from another device.

In some embodiments, the step 101 includes: generating a data signal 200. In some embodiments, in the optical communication system shown in FIG. 2, the data signal 200 may be received from another device. That is, the transmitter 101 may receive the data signal 200 from another device, and input the data signal 200 to the FEC encoder 1011. Alternatively, the data signal 200 may be generated by the FEC encoder 1011.

In S102, an encoding process is performed on the data signal 200 to obtain an encoded signal 300.

The encoded signal 300 includes at least one encoding block 301. The encoded bits within the encoding block 301 is arranged in a rectangular structure, and the encoding block 301 includes a first encoding sub-block 302 and at least one second encoding sub-block 303.

The first encoding sub-block 302 includes a plurality of first component codewords 3021 and a plurality of second component codewords 3022. A first component codeword 3021 and a second component codeword 3022 both include one or more information bits of the plurality of information bits 201 and one or more check bits 401. All information bits 201 in the plurality of first component codewords 3021 and the plurality of second component codewords 3022 constitute an information bit matrix 202. The information bit matrix 202 may have a same side length, or different side lengths. For example, the information bit matrix 202 may have S rows and S columns. S is the length of information bits in the first component codewords 3021 or the length of information bits in the second component codewords 3022, and is a positive integer greater than 1.

The one or more check bits 401 in the first component codeword 3021 are determined by the information bits 201 in the first component codeword 3021. The one or more check bits 402 in the second component codewords 3022 are determined by the information bits 201 in the second component codeword 3022.

Each second encoding sub-block 303 includes a first check matrix 304. The first check matrix 304 includes a plurality of first check bit sets 3041 each including one or more check bits. The first check bit set 3041 is determined based on a plurality of bits in a first bit matrix with same side lengths, and the first check bit set 3041 and the bits in the first bit matrix constitute a third component codeword 3042. The first bit matrix includes any one of: part or all of information bits of the plurality of information bits, part or all of check bits in the plurality of first component codewords, or part or all of check bits in the plurality of second component codewords.

In some embodiments, the bits are located in different rows and different columns of the first bit matrix. That is to say, any two bits from the first bit matrix in the same third component codeword 3042 are located in different rows and different columns of the first bit matrix.

For example, in a case where the first bit matrix is the information bit matrix 202, each second encoding sub-block 303 includes a first check matrix 304. The first check matrix 304 includes a plurality of first check bit sets 3041 each including one or more check bits, the first check bit set 3041 is determined based on one or more information bits 201 of the information bit matrix 202, and the first check bit set 3041 and the information bits 201 used for determining the first check bit set 3041 constitute a third component codeword 3042. Information bits 201 in any third component codeword 3042 are located in different rows and different columns of the information bit matrix 202. That is to say, any two information bits 201 in the same third component codeword 3042 are located in different rows and different columns of the information bit matrix 202. In other words, any two information bits 201 in the same third component codeword 3042 are located in different rows and different columns of the information bit matrix 202.

In the embodiments of the present disclosure, depending on the number of information bits 201 in the data signal 200, the encoded signal 300 may consist of a single encoding block 301 or multiple encoding blocks 301. In other words, all information bits 201 in the data signal 200 may be included in one encoding block 301. That is, all encoded bits in the encoded signal 300 may constitute one encoding block 301, or all information bits 201 in the data signal 200 may be divided into multiple groups, and each group of information bits 201 may be included in one encoding block 301. That is, all encoded bits in the encoded signal 300 may be divided into multiple groups, and each group of encoded bits constitutes one encoding block 301.

It can be understood that, each encoding block 301 is arranged in the rectangular structure, which means that the encoded bits (i.e., bits) of each encoding block 301 are arranged in rows and columns of an array structure. The number of encoded bits in each row is the same, and the number of encoded bits in each column is also the same. The numbers of the rows and the columns of the encoding block 301 are not limited, and they may be the same or different. In the case where the numbers of the rows and the columns of the encoding block 301 are the same, the encoding block 301 is of a square shaped array structure. In the case where the numbers of the rows and the columns of the encoding block 301 are different, the encoding block 301 is of a rectangle shaped array structure.

In the encoding method provided in the embodiments of the present disclosure, a second encoding sub-block is added to the encoding block to extend protection for at least part of the information bits. Since at least part of the information bits are protected by more than two component codes in the two-dimensional space (that is, the bit degree of the at least part of information bits are greater than 2), the number of check bits in the component code is allowed to be relatively small. Compared with the three-dimensional product code, the encoding method of the embodiments of the present disclosure may have smaller decoding memory (less than 1.8 Mbits), lower power consumption and lower delay. In addition, the decoding buffer size may be implemented in optical communication, for example, be applicable to the 1.6T ZR standard. In addition, since the encoded signal has the block code structure in the two-dimensional space, compared with the encoding method using the convolutional code such as a staircase code or a generalized staircase code, the encoding method of the embodiments of the present disclosure may be suitable for applications that adopt the block code.

In some embodiments, the encoding block 301 includes the first encoding sub-block 302 and one second encoding sub-block 303. In some other embodiments, the encoding block 301 includes the first encoding sub-block 302 and a plurality of second encoding sub-blocks 303, and the plurality of second coding sub-blocks 303 are different.

In some embodiments, a part of the encoding block 301 may include first encoding sub-blocks 302, and another part of the encoding block 301 may include first encoding sub-blocks 302 and one second encoding sub-block 303. In some embodiments, a part of the encoding block 301 may include first encoding sub-blocks 302, another part of the encoding block 301 may include first encoding sub-blocks 302 and a plurality of second encoding sub-blocks 303, and the plurality of second coding sub-blocks 303 are different. In some embodiments, a part of the encoding block 301 may include first encoding sub-blocks 302, another part of the encoding block 301 may include first encoding sub-blocks 302 and one second encoding sub-block 303, and yet another part of the encoding block 301 may include first encoding sub-blocks 302 and a plurality of second encoding sub-block 303, where the plurality of second coding sub-blocks 303 are different.

In some embodiments, the first encoding sub-block 302 includes a two-dimensional product code. The two-dimensional product code includes a plurality of first component codewords 3021 and a plurality of second component codewords 3022, a first component codeword 3021 and a second component codeword 3022 both include one or more information bits 201 of the plurality of information bits 201 and one or more check bits 401, and all information bits 201 in the plurality of first component codewords 3021 and the plurality of second component codewords 3022 constitute an information bit matrix 202. The information bit matrix 202 may have a same side length, or different side lengths. For example, the information matrix 202 may have S rows and S columns. S represents the length of information bits in the first component codewords 3021 or the length of information bits in the second component codewords 3022, and is a positive integer greater than 1.

In the first encoding sub-block 302, since all the information bits 201 in the plurality of first component codewords 3021 and the plurality of second component codewords 3022 constitute the S×S information bit matrix 202, any information bit 201 in the information bit matrix 202 belongs to both a first component codeword 3021 and a second component codeword 3022. The number of information bits 201 in the first component codeword 3021 is equal to the number of information bits 201 in the second component codeword 3022. The numbers of the first component codewords 3021 and the second component codewords 3022 of the first encoding sub-block 302 are not limited, and they may be the same or different. In the case where the numbers of the first component codewords 3021 and the second component codewords 3022 of the first encoding sub-block 302 are the same, that is, if the first encoding sub-block 302 has the same side lengths, the first encoding sub-block 302 is of a square shaped array structure. In the case where the numbers of the first component codewords 3021 and the second component codewords 3022 of the first encoding sub-block 302 are different, that is, if the first encoding sub-block 302 has different side lengths, the first encoding sub-block 302 is of a rectangle shaped array structure.

Different first component codewords 3021 may be the same or different, and different second component codewords 3022 may be the same or different. It should be noted that, different first component codewords 3021 mean component codewords in different rows, and different second component codewords 3022 mean component codewords in different columns. The "same" or "different" means that the whole composed of bit values of encoded bits in a first component codeword 3021 is the same as or different from the whole composed of bit values of encoded bits in another first component codeword 3021, or the whole composed of bit values of encoded bits in a second component codeword 3022 is the same as or different from the whole composed of bit values of encoded bits in another second component codeword 3022.

For example, the number of information bits 201 in the first encoding sub-block 302 is M, and M information bits 201 are arranged in S rows and S columns. The S information bits 201 in the first row and corresponding one or more check bits 401 constitute the first component codeword 3021 of the first row; the S information bits 201 in the second row and corresponding one or more check bits 401 constitute the first component codeword 3021 of the second row, and so on; the S information bits 201 in the Sth row and corresponding one or more check bits 401 constitute the first component codeword 3021 of the Sth row. Similarly, the S information bits 201 in the first column and corresponding one or more check bits 401 constitute the second component codeword 3022 of the first column; the S information bits 201 in the second column and corresponding one or more check bits 401 constitutes the second component codeword 3022 of the second column, and so on; the S information bits 201 in the Sth column and corresponding one or more check bits 401 constitute the second component codeword 3022 of the Sth column. M and S are both positive integers greater than 1, and M=S×S.

The check bit(s) 401 in each first component codeword 3021 are determined based on the S information bits 201 in the first component codeword 3021, and the check bit(s) 401 in each second component codeword 3022 are determined based on the S information bits 201 in the second component codeword 3022. The number of the check bit(s) 401 in the first component codeword 3021 and the number of the check bit(s) 401 in the second component codeword 3022 may be the same or different, depending on the encoding type.

In some examples, the first component codeword 3021 and the second component codeword 3022 are encoded by the Hamming code.

In some other examples, the first component codeword 3021 and the second component codeword 3022 are encoded by the BCH2 code.

In yet some other examples, the first component codeword 3021 and the second component codeword 3022 are encoded by the BCH3 code.

In yet some other examples, the first component codeword 3021 is encoded by the Hamming code, and the second component codeword 3022 is encoded by the BCH2 code. Alternatively, the first component codeword 3021 is encoded by the BCH2 code, and the second component codeword 3022 is encoded by the Hamming code.

In yet some other examples, the first component codeword 3021 is encoded by the Hamming code, and the second component codeword 3022 is encoded by the BCH3 code.

Alternatively, the first component codeword 3021 is encoded by the BCH3 code, and the second component codeword 3022 is encoded by the Hamming code.

In yet some other examples, the first component codeword 3021 is encoded by the BCH2 code, and the second component codeword 3022 is encoded by the BCH3 code. Alternatively, the first component codeword 3021 is encoded by the BCH3 code, and the second component codeword 3022 is encoded by the BCH2 code.

It should be noted that the plurality of first component codewords 3021 may also adopt different encoding types. For example, a part of the first component codewords 3021 are encoded by one of the Hamming code, the BCH2 code and the BCH3 code, and the remaining part of the first component codewords 3021 are encoded by another one of the Hamming code, the BCH2 code and the BCH3 code. That is, the part of the first component codewords 3021 and the remaining part of the first component codewords 3021 are encoded by different codes. For another example, a part of the first component codewords 3021 are encoded by one of the Hamming code, the BCH2 code and the BCH3 code; another part of the first component codewords 3021 are encoded by another one of the Hamming code, the BCH2 code and the BCH3 code; and the remaining part of the first component codewords 3021 are encoded by the remaining one of the Hamming code, the BCH2 code and the BCH3 code. In other words, the part of the first component codewords 3021, the another part of the first component codewords 3021, and the remaining part of the first component codewords 3021 are encoded by different codes. In this case, because the encoding types of different first component codewords 3021 may be different, the number of check bits 401 included in each first component codeword 3021 in some first component codewords 3021 is less than the number of check bits 401 included in each first component codeword 3021 in the other first component codewords 3021, and for the first component codeword 3021 with fewer check bits, 0 bits can be added to fill in the empty positions. The 0 bits added to fill the empty positions may not be transmitted during transmission.

Similarly, the plurality of second component codewords 3022 may also adopt different encoding types. For example, a part of the second component codewords 3022 are encoded by one of the Hamming code, the BCH2 code and the BCH3 code, and the remaining part of the second component codewords 3022 are encoded by another one of the Hamming code, the BCH2 code and the BCH3 code. In other words, the part of the second component codes 3022 and the remaining part of the second component codes 3022 are encoded by different codes. For another example, a part of the second component codes 3022 are encoded by one of the Hamming code, the BCH2 code and the BCH3 code; another part of the second component codewords 3022 are encoded by another one of the Hamming code, the BCH2 code and the BCH3 code; and the remaining part of the second component codewords 3022 are encoded by the remaining one of the Hamming code, the BCH2 code and the BCH3 code. In other words, the part of the second component codewords 3022, the another part of the second component codewords 3022, and the remaining part of the second component codewords 3022 are encoded by different codes. In this case, because the encoding types of different second component codes 3022 may be different, the number of check bits 401 included in each second component codeword 3022 in some second component codewords 3022 is less than the number of check bits 401 included in each second component codeword 3022 in the other second component codewords 3022, and for the second component codeword 3022 with fewer check bits, 0 bits can be added to fill in the empty positions. The 0 bits added to fill the empty positions may not be transmitted during transmission.

Similar to the check bits 401 in the first component codeword 3021 or the check bits 401 in the second component codeword 3022 described above, the number of check bits 401 in the first check bit set 3041 of the third component codeword 3042 is determined depending on the encoding type of the third component code 3042.

In some examples, the third component codeword 3042 is encoded by the Hamming code.

In some other examples, the third component codeword 3042 is encoded by the BCH2 code.

In yet some other examples, the third component codeword 3042 is encoded by the BCH3 code.

In yet some other examples, a part of the third component codewords 3042 are encoded by one of the Hamming code, the BCH2 code and the BCH3 code, and the remaining part of the third component codewords 3042 are encoded by another one of the Hamming code, the BCH2 code and the BCH3 code. In other words, the part of the third component codewords 3042 and the remaining part of the third component codewords 3042 are encoded by different codes. Alternatively, a part of the third component codewords 3042 are encoded by one of the Hamming code, the BCH2 code and the BCH3 code; another part of the third component codewords 3042 are encoded by another one of the Hamming code, the BCH2 code and the BCH3 code; and the remaining part of the third component codewords 3042 are encoded by the remaining one of the Hamming code, the BCH2 code and the BCH3 code. In other words, the part of the third component codewords 3042, the another part of the third component codewords 3042, and the remaining part of the third component codewords 3042 are encoded by different codes. In this case, as the encoding types of different third component codewords 3042 may be different, the number of check bits 401 included in each third component codeword 3042 in some third component codewords 3042 is less than the number of check bits 401 included in each third component codeword 3042 in the other third component codewords 3042, and for the third component codeword 3042 with fewer check bits, 0 bits can be added to fill in the empty positions. The 0 bits added to fill the empty positions are not needed to be transmitted during transmission.

In addition, at least one of the first component codeword 3021, the second component codeword 3022 and the third component codeword 3042 is encoded by the BCH4 code. In some embodiments, the first encoding sub-block 302 has the same side lengths, and the side length of the first bit matrix is less than or equal to the side length of the first encoding sub-block 302.

In some embodiments, the first encoding sub-block 302 has different side lengths, and the side length of the first bit matrix is less than or equal to a minimum side length of the first encoding sub-block 302.

In this way, the side length of the first bit matrix may be determined according to the actual bits to be protected, thereby realizing protection on demand, which may reduce the check bits, and reduce the decoding memory, power consumption and delay.

In the embodiments of the present disclosure, the first bit matrix may be the information bit matrix 202, the first encoding sub-block 302, or other matrix.

Each second encoding sub-block 303 includes a first check matrix 304. The first check matrix 304 includes a plurality of first check bit sets 3041 each including one or more check bits. The first check bit set 3041 is determined based on a plurality of bits in a first bit matrix with same side lengths, and the first check bit set 3041 and the bits in the first bit matrix constitute a plurality of third component codewords 3042.

For any third component codewords 3042, in a case where the first bit matrix is the information bit matrix 202, the information bits 201 in a third component codeword 3042 are located in different rows and different columns of the information bit matrix 202. That is, any two different information bits 201 in the same third component codeword 3042 are located in different rows and different columns of the information bit matrix 202. For ease of calculation, coordinates of one or more information bits 201 located in different rows and different columns of the information bit matrix 202 are converted into coordinates in the same column or in the same row, as the coordinates of the information bits 201 in the third component code 3042. Accordingly, the case where the first bit matrix is the first encoding sub-block 302 or other matrix may be similar and will not be repeated here.

In some embodiments, no two bits in the first bit matrix share the same two third component codewords.

For example, as shown in FIGS. 5A, 5B, 7A and 8A, in a case where the first bit matrix is the information bit matrix 202, no two information bits 201 in the same row or column of information bit matrix 202 share the same third component codeword. That is, any two information bits 201 in a third component codeword 3042 cannot be located in the same row or column of the information bit matrix 202. Thus, the information bit 201 has scattering property, and the information bit 201 has strong protection. In these embodiments, two different information bits 201 of the information bit matrix 202 cannot be protected by the same two third component codewords 3042, so that the information bit 201 in the information bit matrix 202 may be protected without redundancy protection.

Accordingly, as shown in FIGS. 5A, 5B, 7B and 8B, in a case where the first bit matrix is the first encoding sub-block 302, no two bits in the first encoding sub-block 302 share the same two component codewords. That is, any two bits from the first encoding sub-block 302 in the third component codeword 3042 cannot be located in the same row or column of the first encoding sub-block 302. Thus, the bit from the first encoding sub-block 302 has scattering property, and the bit from the first encoding sub-block 302 has strong protection. In these embodiments, two different bits of the first encoding sub-block 302 cannot be protected by the same two third component codeword 3042, so that the bits in the first bit matrix may be protected without redundancy protection.

Accordingly, in a case where the first bit matrix is any matrix with the same side lengths, and the side length of the first bit matrix is less than the side length or minimum side length of the first encoding sub-block 302, no two bits in the first bit matrix share the same two component codewords. That is, any two bits from the first bit matrix included in the third component codeword 3042 cannot be located in the same row or column of the first bit matrix. Thus, the bit from the first bit matrix has scattering property, and the bit from the first bit matrix has strong protection. In these embodiments, two different bits of the first bit matrix cannot be protected by the same two third component codeword 3042, so that the bits in the first bit matrix may be protected without redundancy protection.

In some embodiments, the bits from the first bit matrix included in any two third component codewords are in different positions of the first bit matrix.

For example, in each second encoding sub-block 303, in a case where the first bit matrix is the information bit matrix 202, the information bits 201 included in any two third component codewords 3042 are in different positions of the information bit matrix 202. That is, for an information bit 201 of any third component codeword 3042 corresponding to each second encoding sub-block 303, it does not belong to any one of the remaining third component codewords 3042. In these embodiments, the information bit 201 in the information bit matrix 202 may be protected without redundancy protection. Accordingly, the case where the first bit matrix may be the first encoding sub-block 302 or other matrix may be similar and would not be repeated here.

In some embodiments, a third component codeword includes the bits for determining the first check bit set 3041 are bits in a row or column selected from a second bit matrix, and the second bit matrix is determined based on the first bit matrix and an invertible transformation matrix. The invertible transformation matrix may be an invertible matrix descripted below. Thus, the calculation process of determining the first check bit set based on the second bit matrix may simplified.

The method of obtaining S1 bits from the first bit matrix in an i'th third component codeword 3042 is described below. S1 is the side length of the first bit matrix. Coordinates of a bit at i1 row and j1 column of the first bit matrix are represented as (i1, j1), and bits of the i1'th third component codeword 3042 in a kth dimension (e.g., the third dimension) are defined by coordinates (i1,j1) of S1 bits, which satisfy the following formula (1):

$$\pi 1_k(i1, j1) = \begin{bmatrix} a1_k & b1_k \\ c1_k & d1_k \end{bmatrix}(i1, j1)(\mathrm{mod}\, S1) = \tag{1}$$

$$(a1_k i1 + b1_k j1, c1_k j1 + d1_k j1)(\mathrm{mod}\, S1) = (i1', l1).$$

Where $\forall l1 = \{0, 1, 2, \ldots S1-1\}$; $a1_k$, $b1_k$, $c1_k$ and $d1_k$ represents elements in the invertible matrix $\pi 1_k$; mod S1 represents the remainder operation modulo S1; k is an integer greater than or equal to 3, and the kth dimension is a dimension other than the first and second dimensions.

The invertible matrix $\pi 1_x$ is a transformation matrix used for coordinate transformation of the coordinates (i1, j1) of the information bits in the information bit matrix 202. Through the invertible matrix $\pi 1_x$, the information bits with equal i1'values in all obtained coordinates may be used as the information bits in the i1'th third component codeword 3042.

By performing the remainder operation modulo S1, it may be ensured that values of the coordinates (i1', l1) of information bits in the i1'th third component codeword 3042 are within a range of [0, S1-1).

In other words, in order to obtain the third component codeword in the kth dimension, coordinate transformation is performed on information bits in the information bit matrix 202 by constructing the invertible matrix $\pi 1_k$. Thus, the information bits in the information bit matrix 202 are re-arranged. In the re-arranged information bit matrix, information bits with equal i'values in the coordinates are used as the information bits in the i1'th third component codeword, and then check bits in an i1'th column for the i1'th third component codeword are determined based on these information bits. The coordinates of the check bits in the i1'th third component codeword are (l1', i1'); the number of columns of check bits in the row check matrix 203 is defined as $L_{P1}$, the number of rows of check bits in the column check matrix 204 are defined as $L_{P2}$, the number of rows of check bits in the first check matrix 304 of the second encoding sub-block 303 in the kth dimension is defined as $L_{Pk}$, and $\forall 11' \in [S1 + L_{P2} + \ldots L_{P(k-1)}, S1 + L_{P2} + \ldots L_{Pk})$.

In an implementation, values of $a1_k$, $b1_k$, $c1_k$ and $d1_k$ in the invertible matrix $\pi 1_k$ are 0, 1, 1, and k−1, respectively. By substituting the values into formula (1), formula (2) is obtained:

$$\pi 1_k(i1, j1) = \begin{bmatrix} 0 & 1 \\ 1 & k-1 \end{bmatrix}(i1, j1)(\bmod S1) = (j1, i1 + (k-1)j1)(\bmod S1). \quad (2)$$

In another implementation, values of $a1_k$, $b1_k$, $c1_k$ and $d1_k$ in the invertible matrix $\pi 1_k$ are −(k−1), 1, 1−(k−1)², k−1, respectively. By substituting the values into formula (1), formula (3) is obtained:

$$\pi 1_k(i1, j1) = \begin{bmatrix} -(k-1) & 1 \\ 1-(k-1)^2 & k-1 \end{bmatrix}(i1, j1)(\bmod S1) = \quad (3)$$

$$\left(-(k-1)i1 + j1, \left(1-(k-1)^2\right)i1 + (k-1)j1\right)(\bmod S1).$$

In a case where the elements of the invertible matrix $\pi 1_k$ take the above values and the least prime factor of S1 is greater than k, no two information bits in the information bit matrix 201 are protected by the same two or more component codewords (including those in both the first and second encoding sub-blocks).

In some embodiments, bits in different third component codewords are bits in a row or column selected from a same second bit matrix or different second bit matrices. Different second bit matrices may be determined based on the same first bit matrix and different invertible transformation matrices, different first bit matrices and the same invertible transformation matrix, or different first bit matrices and different invertible transformation matrices.

For example, by employing a preset algorithm, a coordinate transformation is applied to at least part of the bits in the first bit matrix to obtain a re-arranged second bit matrix. Each first check bit set 3041 is generated according to a corresponding row or column of bits in the re-arranged second bit matrix, and the coordinates of each row or column of bits in the re-arranged second bit matrix are located in different rows and different columns of the first bit matrix.

Figure 5A:
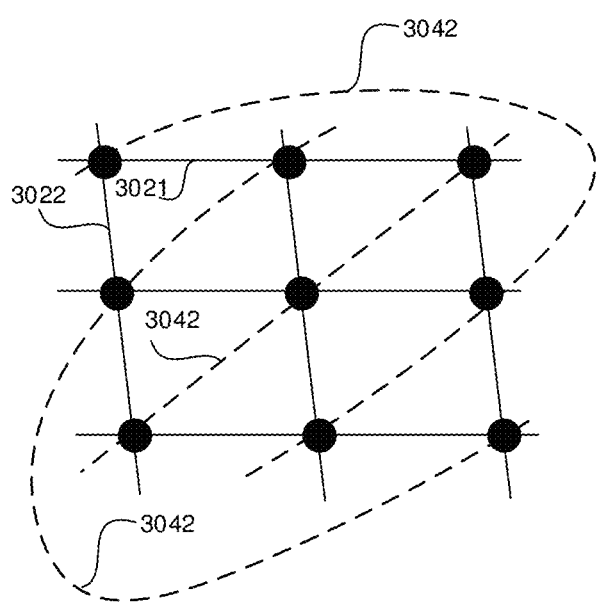
FIG. 5A is a schematic diagram of multiple component codes, in accordance with some embodiments of the present disclosure.

As shown in FIG. 5A, a 3×3 first bit matrix is used as an example, the coordinates of three bits in the first row and first column, the second row and third column, and the third row and second column are converted to coordinates in the same column, and a first check bit set 3041 is obtained based on the three bits, thereby obtaining a third component codeword 3042; the coordinates of three bits in the first row and second column, the second row and first column, and the third row and third column are converted to coordinates in the same column, and another first check bit set 3041 is obtained based on the three bits, thereby obtaining another third component codeword 3042; and the coordinates of three bits in the first row and third column, the second row and second column, and the third row and first column are converted to coordinates in the same column, and yet another first check bit set 3041 is obtained based on the three bits, thereby obtaining yet another third component codeword 3042. It should be noted that the 3×3 first bit matrix is only an illustrative quantity for convenience of description.

In actual applications, the number of bits in each row and column of the first bit matrix may be more than 3.

Figure 5B:
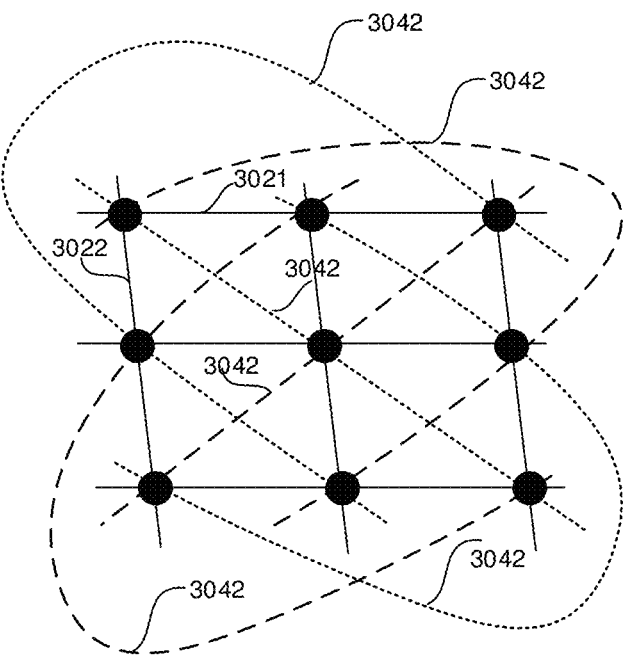
FIG. 5B is another schematic diagram of multiple component codes, in accordance with some embodiments of the present disclosure.

As shown in FIG. 5B, the 3×3 first bit matrix is still used as an example, and there are two second encoding sub-blocks 303. For one of the two second encoding sub-blocks 303, the coordinates of three bits in the first row and first column, the second row and third column, and the third row and second column are converted to coordinates in the same column, and a first check bit set 3041 is obtained based on the three bits, thereby obtaining a third component codeword 3042; the coordinates of three bits in the first row and second column, the second row and first column, and the third row and third column are converted to coordinates in the same column, and another first check bit set 3041 is obtained based on the three bits, thereby obtaining another third component codeword 3042; the coordinates of three bits in the first row and third column, the second row and second column, and the third row and first column are converted to coordinates in the same column, and yet another first check bit set 3041 is obtained based on the three bits, thereby obtaining yet another third component codeword 3042. For the other one of the two second encoding sub-blocks 303, the coordinates of three bits in the first row and third column, the second row and first column, and the third row and second column are converted to coordinates in the same column, and a first check bit set 3041 is obtained based on the three bits, thereby obtaining a third component codeword 3042; the coordinates of three bits in the first row and second column, the second row and third column, and the third row and first column are converted to coordinates in the same column, and another first check bit set 3041 is obtained based on the three bits, thereby obtaining another third component codeword 3042; the coordinates of three bits in the first row and first column, the second row and second column, and the third row and third column are converted to coordinates in the same column, and yet another first check bit set 3041 is obtained based on the three bits, thereby obtaining yet another third component codeword 3042.

Based on this, for each information bit 201 of at least part of information bits 201 in the first bit matrix, the information bit 201 belongs to at least three component codewords, which are the first component codeword 3021 and the second component codeword 3022 in the first encoding sub-block 302 and the third component codeword 3042 in each second encoding sub-block 303. Therefore, the information bit 201 is protected by at least three component codewords. That is, the bit degree of the information bit 201 is at least 3. Since the bit degree of each information bit 201 of at least part of information bits 201 in the first bit matrix is greater than 2, the relatively weak component codeword is allowed to be used for the part of the information bits 201 (i.e., the number of check bits of the component codeword can be relatively small).

It can be understood that, in the case where the encoding block 301 includes one second encoding sub-block 303, at least part of information bits 201 belongs to three component codewords, and the bit degree of the part of information bits 201 is 3; in the case where the encoding block 301 includes two different second encoding sub-blocks 303, at least part of information bits 201 belongs to four component codewords, which are the first component codeword 3021, the second component codeword 3022 and respective third component codewords 3042 in two different second encoding sub-blocks 303, and the bit degree of the part of information bits 201 is 4.

In addition, it can be understood from the above description that the first component codeword 3021 and the second component codeword 3022 are in the first dimension and the second dimension respectively; in the case of only one second encoding sub-block 303 included in the encoding block 301, the third component codeword 3042 for the second encoding sub-block 303 is in the third dimension; in the case of two second encoding sub-blocks 303 included in the encoding block 301, the third component codewords 3042 for the two second encoding sub-block 303 are in the third dimension and the fourth dimension respectively; in the case of more than two second encoding sub-blocks 303 included in the encoding block 301, the third component codewords 3042 for the second encoding sub-blocks 303 are in a plurality of higher dimensions except for the first dimension and the second dimension respectively, and the third component codewords 3042 in different second encoding sub-blocks 303 are in different dimensions. All dimensions are located in a two-dimensional space.

In some embodiments, the bits in different third component codewords may be bits from different second encoding sub-blocks, or may be bits from the same second encoding sub-block. For example, the bits in some third component codewords may be bits from a second encoding sub-block 302, and the bits in some other third component codewords may be bits from another second encoding sub-block 302.

In some embodiments, the number of information bits 201 in the first component codeword 3021 and the number of information bits 201 in the second component codeword 3022 are equal. The number of information bits 201 in the first component codeword 3021 or the number of information bits 201 in the second component codeword 3022 and the number of information bits 201 in the third component codeword 3042 may be or may be not equal.

In some embodiments, the number of information bits 201 in the first component codeword 3021, the number of information bits 201 in the second component codeword 3022, and the number of information bits 201 in the third component codeword 3042 are equal. In this way, the encoding of each dimension is relatively simple.

In some embodiments, the numbers of the first check bit sets 3041 in different second encoding sub-blocks 303 may not be limited, and they may be equal, or may not be equal.

In some embodiments, the number of the first check bit sets 3041 in each second encoding sub-block 303 may not be limited, and it may be equal to or less than the side length of the first bit matrix.

In some embodiments, the first encoding sub-block 302 further includes a plurality of double check bits. The double check bits are the "parity on parity" bits. The double check bits may be check bits of the first component codeword, and be determined by check bits (and the filling 0's) of the second component codeword; or the double check bits may be check bits of the second component codeword, and be determined by check bits (and the filling 0's) of the first component codeword. Therefore, the first bit matrix includes any one of: part or all of information bits of the plurality of information bits, part or all of check bits in the plurality of first component codewords, part or all of check bits in the plurality of second component codewords, or part or all of double check bits of the plurality of double check bits.

Figure 6:
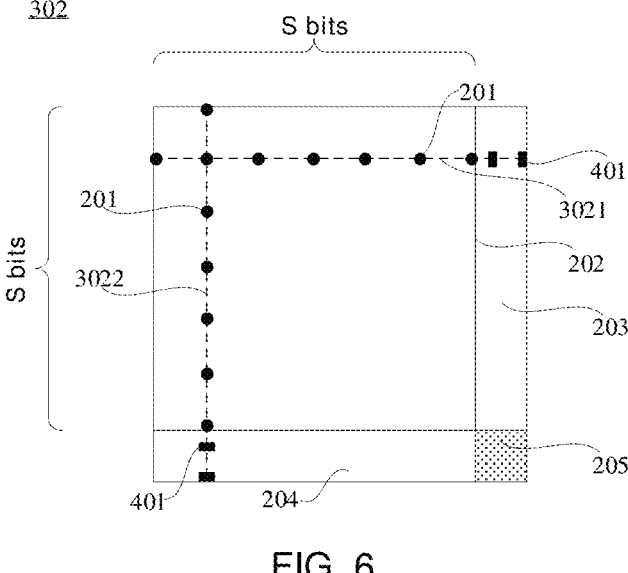
FIG. 6 is a schematic diagram of a first encoding sub-block, in accordance with some embodiments of the present disclosure.

In some embodiments, as shown in FIG. 6, the first encoding sub-block 302 includes the information bit matrix 202, a row check matrix 203, a column check matrix 204 and a double check matrix 205. The double check matrix 205 may include a plurality of double check bits. The row check matrix 203 and the information bit matrix 202 are in a same row but in different columns, and the column check matrix 204 and the information bit matrix 202 are in a same column but in different rows. The row check matrix 203 and the column check matrix 204 are used to correct errors in the information bit matrix 202. The double check matrix 205 is used to correct errors in the row check matrix 203 and the column check matrix 204.

The double check matrix 205 includes a plurality of double check bits described above.

FIG. 6 exemplarily and visually shows the arrangement of the information bit matrix 202, the row check matrix 203, the column check matrix 204 and the double check matrix 205 in the first encoding sub-block 302, where the information bit matrix 202 is a matrix composed of information bits 201 of S rows and information bits 201 of S columns.

The row check matrix 203 is located on the right of the information bit matrix 202, the column check matrix 204 is located below the information bit matrix 202, and the double check matrix 205 is located below the row check matrix 203 and on the right of the column check matrix 204.

The row check matrix 203 may include check bits 401 arranged in an array. Each row of check bits 401 in the row check matrix 203 correspond to respective one row of information bits 201 in the information bit matrix 202, and each row of information bits 201 and a corresponding row of check bits 401 constitute one first component codeword 3021. Each row of check bits 401 in the row check matrix 203 includes one or more check bits 401, which are determined based on a corresponding row of information bits 201.

The column check matrix 204 may include check bits 401 arranged in an array. Each column of check bits 401 in the column check matrix 204 correspond to respective one column of information bits 201 in the information bit matrix 202, and each column of information bits 201 and a corresponding column of check bits 401 constitute one second component codeword 3022. Each column of check bits 401 in the column check matrix 204 includes one or more check bits 401, which are determined based on a corresponding column of information bits 201.

The double check matrix 205 is used to perform error checking on codewords consisting entirely of parity bits. In a region where the row check matrix 203 and the double check matrix 205 are located, check bits of each column constitute a column codeword (the column codeword is also a component codeword); and in a region where the column check matrix 204 and the double check matrix 205 are located, check bits of each row constitute a row codeword (the row codeword is also a component codeword). Thus, for the check bit in the row check matrix 203, the check bit is constrained by the first component codeword 3021 and the column codeword, and the bit degree of the check bit in the row check matrix 203 is 2. For the check bit in the column check matrix 204, the check bit is constrained by the second component codeword 3022 and the row codeword, and the bit degree of the check bit in the column check matrix 204 is 2. For the check bit in the double check matrix 205, the check bit is constrained by the row codeword and the column codeword, and the bit degree of the check bit in the double check matrix 205 is also 2.

In the first and second dimensions, since the bit degree of each check bit is 2, it is not easy to encounter the issue of miss correction or not able to correct errors. Thus, the reliability of data transmission is high.

In some embodiments, as shown in FIGS. 7A, 7B, 8A and 8B, the second encoding sub-block 303 further includes a second check matrix 305. The second check matrix 305 is used to correct errors in check bits of the first check matrix 304.

The check bits in the second check matrix 305 are determined based on the check bits in the first check matrix 304 to correct errors in the check bits of the first check matrix 304. In this way, through the second check matrix 305, the encoded signal encoded by the encoding method provided in the embodiments of the present disclosure has multiple error verifications, so that the reliability of data transmission can be further improved.

In some embodiments, the second check matrix 305 may include a plurality of second check bit sets 3051 each including one or more check bits, and the second check bit set 3051 may be determined based on a plurality of check bits of the first check matrix 304.

Figure 7A:
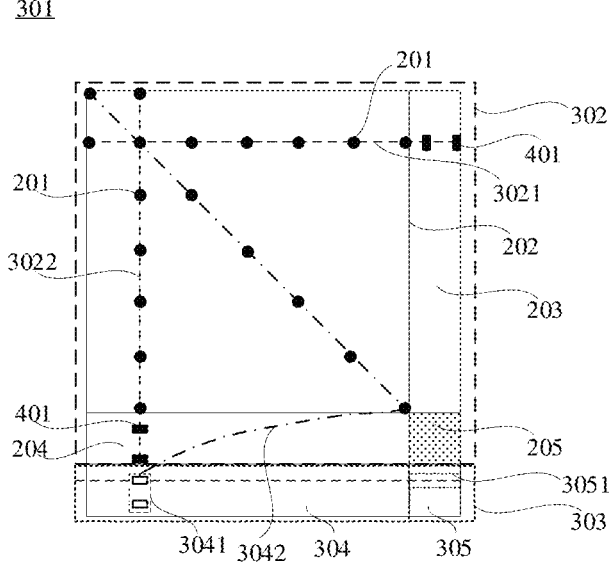
FIG. 7A is a schematic diagram of an encoding block when the first bit matrix is the information bit matrix, in accordance with some embodiments of the present disclosure.
Figure 7B:
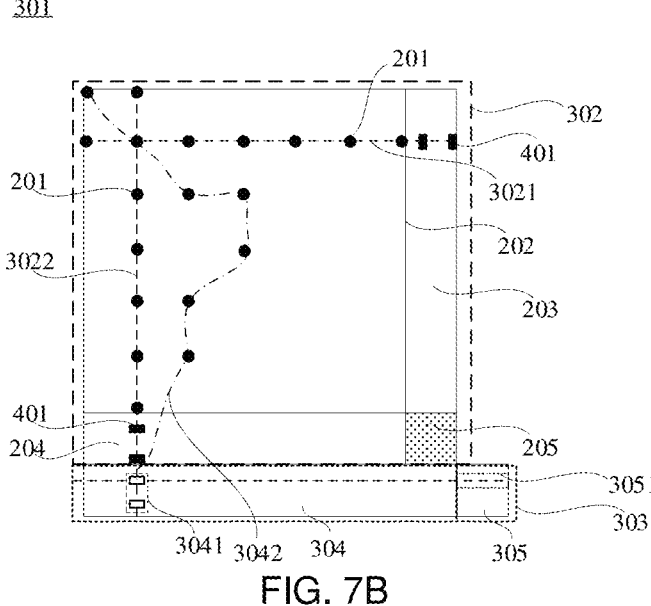
FIG. 7B is a schematic diagram of an encoding block when the first bit matrix is the first encoding sub-block, in accordance with some embodiments of the present disclosure.

In some embodiments, as shown in FIGS. 7A and 7B, the at least one second encoding sub-block 303 and the first encoding sub-block 302 are in the same column but in different rows, and the first check matrix 304 and the second check matrix 305 are in the same row but in different columns; the second check matrix 305 includes a plurality of second check bit sets 3051 each including one or more check bits, and the second check bit set 3051 is determined based on a row of check bits in the first check matrix 304, and check bits in the row of check bits are located in the plurality of first check bit sets 3041 of the first check matrix 304.

For example, as show in FIG. 7A, the columns of check bits (i.e., the plurality of first check bit sets 3041) in the first check matrix 304 are aligned with the columns of information bits 201 in the information bit matrix 202, and the rows of check bits (i.e., the plurality of second check bit sets 3051) in the second check matrix 305 are aligned with the rows of check bits in the first check matrix 304. Or, as show in FIG. 7B, the columns of check bits (i.e., the plurality of first check bit sets 3041) in the first check matrix 304 are aligned with the columns of the bits in the first encoding sub-block 302, and the rows of check bits (i.e., the plurality of second check bit sets 3051) in the second check matrix 305 are aligned with the rows of check bits in the first check matrix 304. Or, the columns of check bits (i.e., the plurality of first check bit sets 3041) in the first check matrix 304 are aligned with the columns of the bits in the first bit matrix, and the rows of check bits (i.e., the plurality of second check bit sets 3051) in the second check matrix 305 are aligned with the rows of check bits in the first check matrix 304.

FIG. 7A exemplarily and visually shows an arrangement of a first encoding sub-block 302 and a second encoding sub-block 303 when the first bit matrix is the information matrix 202, and FIG. 7B exemplarily and visually shows an arrangement of a first encoding sub-block 302 and a second encoding sub-block 303 when the first bit matrix is the first encoding sub-block 302; and in FIGS. 7A and 7B, the second encoding sub-block 303 is located below the first encoding sub-block 302, and the second check matrix 305 is located on the right of the first check matrix 304. In some other embodiments, the second encoding sub-block 303 may be located above the first encoding sub-block 302, and the second check matrix 305 is located on the right of the first check matrix 304.

It should be understood that, for the check bit in the second check matrix 305, the check bit is constrained by the corresponding row of check bits in the first check matrix 304, and thus the bit degree of the check bit is 1. Although the error probability of the check bit in the second check matrix 305 is relatively high, since the BER is calculated from the information bits 201, it does not matter whether there are more errors in the second check matrix 305.

Figure 8A:
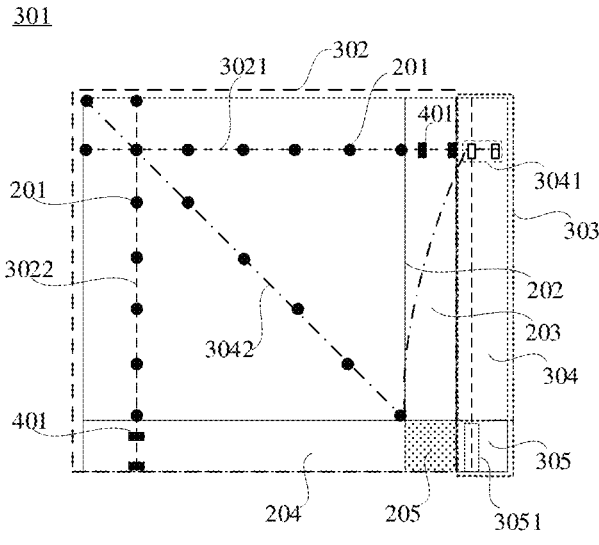
FIG. 8A is a schematic diagram of another encoding block when the first bit matrix is the information bit matrix, in accordance with some embodiments of the present disclosure.
Figure 8B:
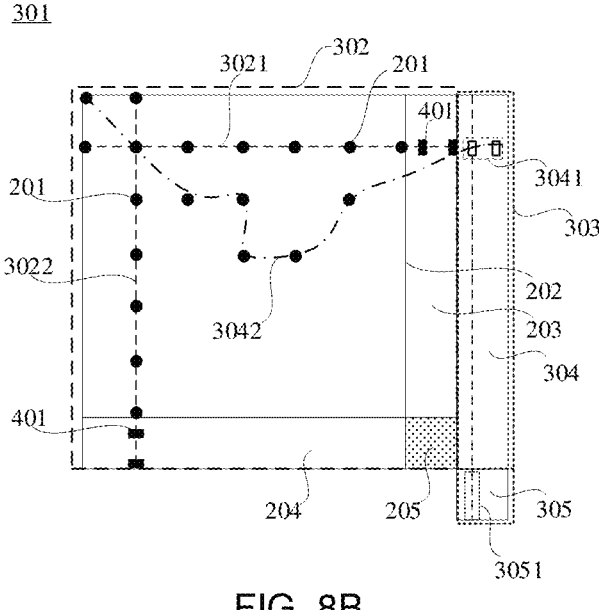
FIG. 8B is a schematic diagram of another encoding block when the first bit matrix is the first encoding sub-block, in accordance with some embodiments of the present disclosure.

In some embodiments, as shown in FIGS. 8A and 8B, the at least one second encoding sub-block 303 and the first encoding sub-block 302 are in the same row but in different columns, and the first check matrix 304 and the second check matrix 305 are in the same column but in different rows; the second check matrix 305 includes a plurality of second check bit sets 3051 each including one or more check bits, and the second check bit set 3051 is determined based on a column of check bits in the first check matrix 304, and check bits in the column of check bits are located in the plurality of first check bit sets 3041 of the first check matrix 304.

For example, as shown in FIG. 8A, the rows of check bits (i.e., the plurality of first check bit sets 3041) in the first check matrix 304 are aligned with the rows of information bits 201 in the information bit matrix 202, and the columns of check bits (i.e., the plurality of second check bit sets 3051) in the second check matrix 305 are aligned with the columns of check bits in the first check matrix 304. Or, as shown in FIG. 8B, the rows of check bits (i.e., the plurality of first check bit sets 3041) in the first check matrix 304 are aligned with the rows of the bits in the first encoding sub-block 302, and the columns of check bits (i.e., the plurality of second check bit sets 3051) in the second check matrix 305 are aligned with the columns of check bits in the first check matrix 304. Or, the rows of check bits (i.e., the plurality of first check bit sets 3041) in the first check matrix 304 are aligned with the rows of the bits in the first bit matrix, and the columns of check bits (i.e., the plurality of second check bit sets 3051) in the second check matrix 305 are aligned with the columns of check bits in the first check matrix 304.

FIG. 8A exemplarily and visually shows another arrangement of a first encoding sub-block 302 and a second encoding sub-block 303 when the first bit matrix is the information bit matrix 202, and FIG. 8B exemplarily and visually shows another arrangement of a first encoding sub-block 302 and a second encoding sub-block 303 when the first bit matrix is the first encoding sub-block 302; and in FIGS. 8A and 8B, the second encoding sub-block 303 is located on the right of the first encoding sub-block 302, and the second check matrix 305 is located below the first check matrix 304. In some other embodiments, the second encoding sub-block 303 may be located on the left of the first encoding sub-block 302, and the second check matrix 305 is located below the first check matrix 304.

In some embodiments, as shown in FIGS. 9A, 9B, 10A and 10B, the at least one second encoding sub-block 303 includes a plurality of second encoding sub-blocks 303, and the plurality of second encoding sub-blocks 303 are located on the same side or on opposite sides of the first encoding sub-block 302.

Figure 9A:
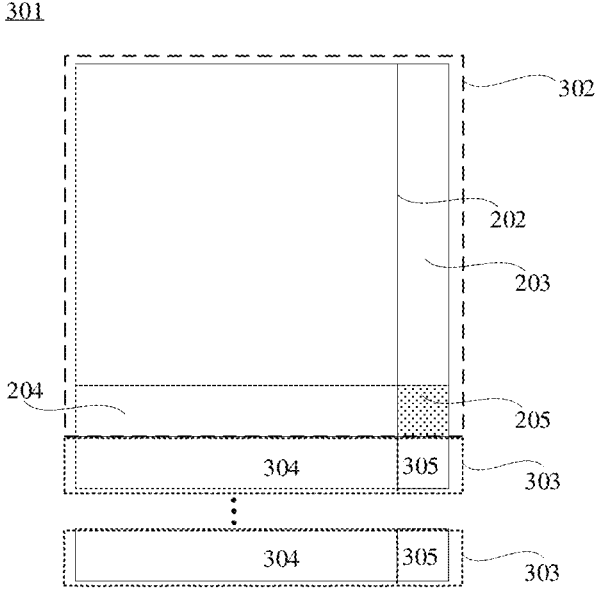
FIG. 9A is a schematic diagram of yet another encoding block when the first bit matrix is the information bit matrix, in accordance with some embodiments of the present disclosure.
Figure 9B:
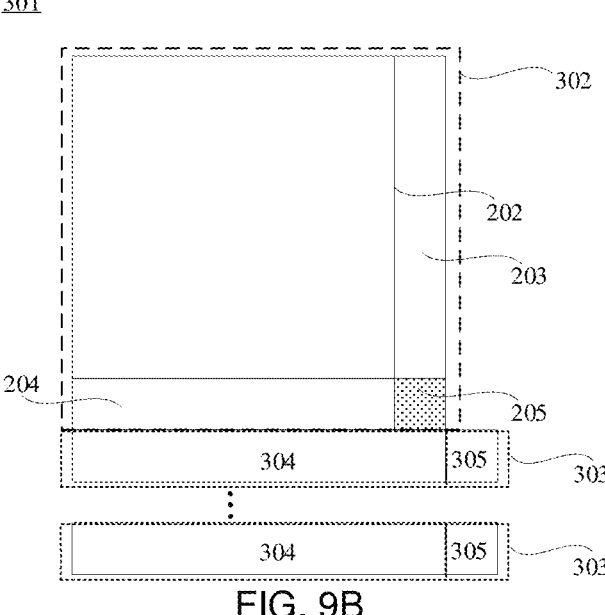
FIG. 9B is a schematic diagram of yet another encoding block when the first bit matrix is the first encoding sub-block, in accordance with some embodiments of the present disclosure.

In some examples, the plurality of second encoding sub-blocks 303 are arranged on the same side of the first encoding sub-block 302 along the row direction. For example, as shown in FIGS. 9A and 9B, the plurality of second encoding sub-blocks 303 are located below the first encoding sub-block 302. Alternatively, the plurality of second encoding sub-blocks 303 are located above the first encoding sub-block 302.

Figure 10A:
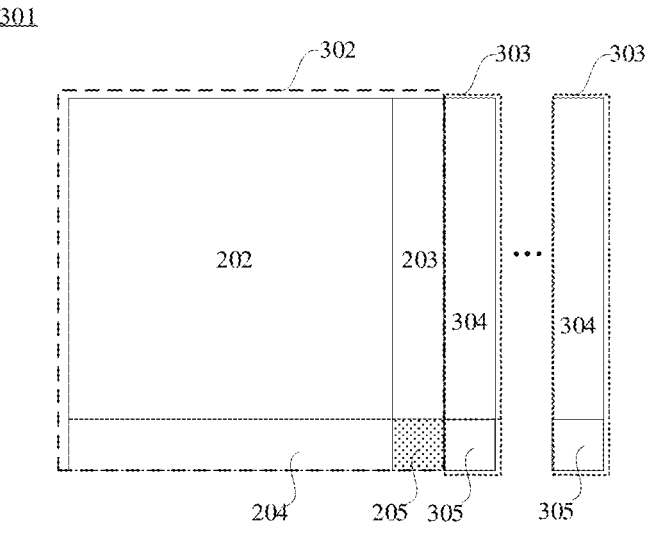
FIG. 10A is a schematic diagram of yet another encoding block when the first bit matrix is the information bit matrix, in accordance with some embodiments of the present disclosure.
Figure 10B:
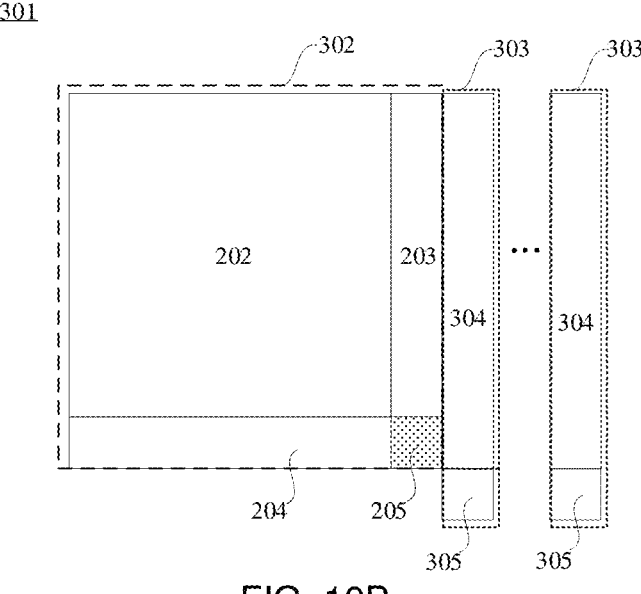
FIG. 10B is a schematic diagram of yet another encoding block when the first bit matrix is the first encoding sub-block, in accordance with some embodiments of the present disclosure.

In some examples, the plurality of second encoding sub-blocks 303 are arranged on the same side of the first encoding sub-block 302 along the column direction. For example, as shown in FIGS. 10A and 10B, the plurality of second encoding sub-blocks 303 are located on the right of the first encoding sub-block 302. Alternatively, the plurality of second encoding sub-blocks 303 are located on the left of the first encoding sub-block 302.

In some embodiments, the plurality of second encoding sub-blocks 303 may also be divided into two groups of second encoding sub-blocks, which are a first group of second encoding sub-blocks and a second group of second encoding sub-blocks, and the number of second encoding sub-blocks 303 in the first group of second encoding sub-blocks and the number of second encoding sub-blocks 303 in the second group of second encoding sub-blocks may or may not be equal; the first group of second encoding sub-blocks and the second group of second encoding sub-blocks may be respectively located on the upper and lower sides of the first encoding sub-block 302, or may be respectively located on the left and right sides of the first encoding sub-block 302, or may be respectively located on the lower and right sides of the first encoding sub-block 302, or may be respectively located on the lower and left sides of the first encoding sub-block 302, or may be respectively located on the upper and right sides of the first encoding sub-block 302, or may be respectively located on the upper and left sides of the first encoding sub-block 302.

In some embodiments, the plurality of second encoding sub-blocks 303 may also be divided into three groups of second encoding sub-blocks, which are a first group of second encoding sub-blocks, a second group of second encoding sub-blocks and a third group of second encoding sub-blocks, and the number of second encoding sub-blocks 303 in the first group of second encoding sub-blocks, the number of second encoding sub-blocks 303 in the second group of second encoding sub-blocks and the number of second encoding sub-blocks 303 in the third group of second encoding sub-blocks may be or may not be equal. The first group of second encoding sub-blocks, the second group of second encoding sub-blocks and the third group of second encoding sub-blocks may be respectively located on the upper, lower and left sides of the first encoding sub-block 302, or may be respectively located on the upper, lower and right sides of the first encoding sub-block 302, or may be respectively located on the left, right and upper sides of the first encoding sub-block 302, or may be respectively located on the left, right and lower sides of the first encoding sub-block 302.

In some embodiments, the plurality of second encoding sub-blocks 303 may also be divided into four groups of second encoding sub-blocks, which are a first group of second encoding sub-blocks, a second group of second encoding sub-blocks, a third group of second encoding sub-blocks and a fourth group of second encoding sub-blocks, and the number of second encoding sub-blocks 303 in the first group of second encoding sub-blocks, the number of second encoding sub-blocks 303 in the second group of second encoding sub-blocks, the number of second encoding sub-blocks 303 in the third group of second encoding sub-blocks and the number of second encoding sub-blocks 303 in the fourth group of second encoding sub-blocks may be or may not be equal; the first group of second encoding sub-blocks, the second group of second encoding sub-blocks, the third group of second encoding sub-blocks and the fourth group of second encoding sub-blocks may be respectively located on the upper, lower, left and right sides of the first encoding sub-block 302.

By arranging the plurality of second encoding sub-blocks 303, the encoding block 301 has dimensions greater than 3, and the bit degree of at least part of the information bit 201 is also greater than 3. Therefore, the error correction capability of the encoding block 301 may be higher, and the encoding complexity and OH of each component codeword may be reduced, thereby reducing decoding memory required for the corresponding decoding stage. As a result, the encoding block has not only the good error correction capability but also the performance of low component codeword complexity and low decoding memory of OH.

The encoding method provided in the embodiments of the present disclosure will be described in detail below through an example.

A data signal with a plurality of information bits 201 is received by the FEC encoder first, and then an encoding process is performed by the FEC encoder on the data signal to obtain an encoded signal of the systematic code. As shown in FIG. 7A, encoded bits in the encoded signal are located in a rectangular encoding block 301 (that is, the encoded signal is located in a rectangular buffer), and the encoding block 301 includes a first encoding sub-block 302 and a second encoding sub-block 303. As shown in FIGS. 6 and 7A, the first encoding sub-block 302 includes a two-dimensional product codeword composed of an information bit matrix 202, a row check matrix 203, a column check matrix 204 and a double check matrix 205. The information bit matrix 202 includes a plurality of information bits 201, which are arranged in a square with a side length of S bits. The row check matrix 203 is located at the right edge of the information bit matrix 202, and the row check matrix 203 includes a plurality of check bits 401 arranged in an array. An ith row of information bits in the information bit matrix 202 corresponds to an ith row of check bits in the row check matrix 203, and the ith row of information bits and the ith row of check bits constitute an ith first component codeword 3021 in the first dimension (coordinates of the bits in the first component codeword 3021 are (i, ·)). The column check matrix 204 is located at the lower edge of the information bit matrix 202, and the column check matrix 204 includes a plurality of check bits 401 arranged in an array. An ith column of information bits in the information bit matrix 202 corresponds to an ith column of check bits in the column check matrix 203, and the ith column of information bits and the ith column of check bits constitute an ith second component codeword 3022 in the second dimension (coordinates of the bits in the second component codeword 3022 are (·,i)). The double check matrix 205 is located at the lower right corner of the information bit matrix 202; and check bits in the double check matrix 205 and the check bits in the row check matrix 203 constitute multiple column component codewords (e.g., two column component codewords), and the check bits in the double check matrix 205 and the check bits in the column check matrix 204 constitute multiple row component codewords (e.g., two row component codewords). i is a positive integer greater than or equal to 0 and less than or equal to S−1.

The second encoding sub-block 303 is located at the lower edge of the first encoding sub-block 302. The second encoding sub-block 303 includes a first check matrix 304 and a second check matrix 305 located at the right edge of the first check matrix 304. The first check matrix 304 includes check bits arranged in Q×S, the S columns of check bits in the first check matrix 304 are aligned with the S columns of information bits in the information bit matrix 202, and each column of check bits in the first check matrix 304 form a first check bit set 3041. The second check matrix 305 includes Q rows of check bits, and each row of check bits in the second check matrix 305 form a second check bit set 3051; the Q rows of check bits in the second check matrix 305 are aligned with the Q rows of check bits in the first check matrix 304, and a row of check bits in the second check matrix 305 and a row of check bits in the first check matrix 304 form a component codeword. Q is a positive integer.

The i'th column of check bits in the first check matrix 304 is determined based on S information bits in the information bit matrix 202, and the i'th column of check bits in the first check matrix 304 and corresponding S information bits together constitute an i'th third component codeword 3042 in the third dimension. i' is a positive integer greater than or equal to 0 and less than or equal to S−1.

How to obtain the S information bits in the i'th third component codeword 3042 is described below. The coordinates of the information bit at the i row and j column of the information bit matrix 202 are represented as (i, j), and the information bits of the i'th third component codeword 3042 in the kth dimension (e.g., the third dimension) are defined by the coordinates (i, j) of the S information bits, which satisfy the following formula (4):

$$\pi_k(i, j) = \begin{bmatrix} a_k & b_k \\ c_k & d_k \end{bmatrix}(i, j)(\mathrm{mod}\, S) = (a_k i + b_k j, c_k i + d_k j)(\mathrm{mod}\, S) = (i', l). \quad (4)$$

Where $\forall l = \{0, 1, 2, \ldots S-1\}$, and $a_k$, $b_k$, $c_k$ and $d_k$ represents elements in the invertible matrix $\pi_k$; mod S represents the remainder operation modulo S; k is an integer greater than or equal to 3, and the kth dimension is a dimension other than the first and second dimensions.

The invertible matrix $\pi_k$ is a transformation matrix used for coordinate transformation of the coordinates (i, j) of the information bits in the information bit matrix 202. Through the invertible matrix $\pi_k$, the information bits with equal i'values in all obtained coordinates can be used as the information bits in the i'th third component codeword 3042.

By performing the remainder operation modulo S, it can be ensured that the values of the coordinates (i', l) of the information bit in the i'th third component codeword 3042 is within the range of [0, S−1).

In other words, in order to obtain the third component codeword in the kth dimension, coordinate transformation is performed on the information bits in the information bit matrix 202 by constructing the invertible matrix $\pi_k$. Thus, the information bits in the information bit matrix 202 are re-arranged. In the re-arranged information bit matrix, information bits with equal i'values in the coordinates are used as the information bits in the i'th third component codeword, and then the i'th column of check bits for the i'th third component codeword are determined based on these information bits. The coordinates of the check bits in the i'th third component codeword are (l', i'); the number of columns of check bits in the row check matrix 203 is defined as $L_{P1}$, the number of rows of check bits in the column check matrix 204 are defined as $L_{P2}$, the number of rows of check bits in the first check matrix 304 of the second encoding sub-block 303 in the kth dimension is defined as $L_{Pk}$, and $\forall l' \in [S+L_{P2}+ \ldots L_{P(k-1)}, S+L_{P2}+ \ldots L_{Pk})$.

In an implementation, values of $a_k$, $b_k$, $c_k$ and $d_k$ in the invertible matrix $\pi_k$ are 0, 1, 1, k−1, respectively. By substituting the values into formula (4), formula (5) is obtained:

$$\pi_k(i, j) = \begin{bmatrix} 0 & 1 \\ 1 & k-1 \end{bmatrix}(i,)(\mathrm{mod}\, S) = (j, i + (k-1)j)(\mathrm{mod}\, S). \quad (5)$$

In another implementation, values of $a_k$, $b_k$, $c_k$ and $d_k$ in the invertible matrix $\pi_k$ are −(k−1), 1, 1−(k−1)², k−1, respectively. By substituting the values into formula (4), formula (6) is obtained:

$$\pi_k(i, j) = \begin{bmatrix} -(k-1) & 1 \\ 1-(k-1)^2 & k-1 \end{bmatrix}(i, j)(\mathrm{mod}\, S) = \quad (6)$$
$$(-(k-1)i + j, (1 - (k-1)^2)i + (k-1)j)(\mathrm{mod}\, S).$$

When the elements of the invertible matrix $\pi_k$ take the above values and the least prime factor of S is greater than k, no two information bits in the information bit matrix 201 are protected by the same two or more component codewords.

Figures 11A, 11B:
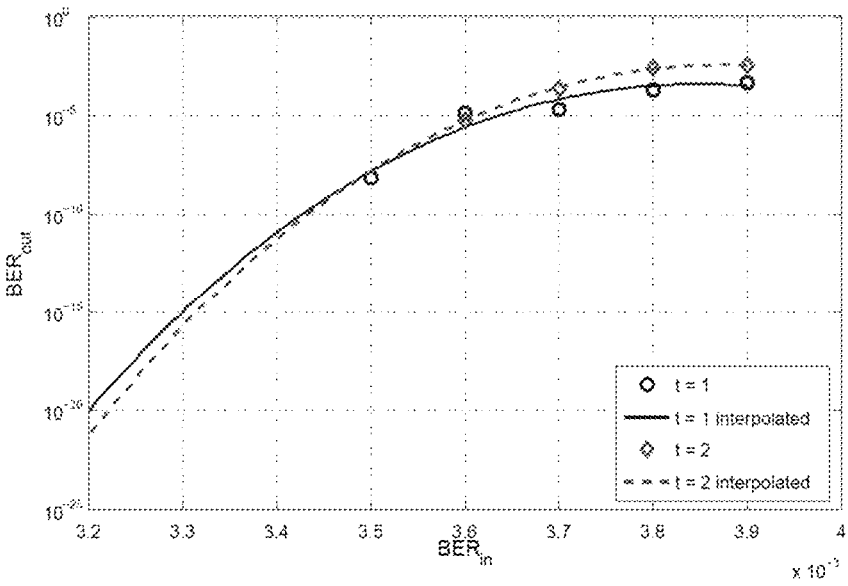
FIG. 11A shows a BER curve of the encoding method, in accordance with some embodiments of the present disclosure.
FIG. 11B shows a comparison between the performance of the encoding method of the embodiments of the present disclosure and the performance of encoding methods using a staircase code and a generalized staircase code.

FIG. 11A shows a BER curve of the encoding method, in accordance with some embodiments of the present disclosure. t represents the number of error corrections. FIG. 11A shows a curve of output BER versus input BER for different number of corrections. As may be seen from FIG. 11A, the input BER is proportional to the output BER, that is, the greater the input BER, the greater the output BER. For a certain threshold, if the input BER is less than the threshold, the more errors corrected, the smaller the corresponding output BER; if the input BER is greater than the threshold, the more errors corrected, the larger the corresponding output BER. FIG. 11B shows a comparison between the performance of the encoding method of the embodiments of the present disclosure and the performance of encoding methods using a staircase code and a generalized staircase code. 3D product 1 and 3D product 2 represent codes obtained by using the encoding method provided in the embodiments of the present disclosure; Gen.SC. and SC represent codes obtained by using the generalized staircase code and the staircase code, respectively. GF size represents the size of the Galois field; DEC Mem. represents the decoding memory. BER_th represents the maximum input BER for the output BER to be below 1e-15. S represents the side length of the information bit block (i.e., the information bit matrix described herein). It can be seen from FIG. 11B that the encoding method provided in the embodiments of the present disclosure has smaller decoding memory and lower input BER.

Figure 12:
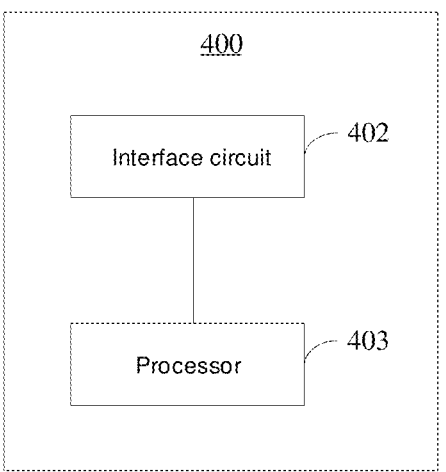
FIG. 12 is a structural diagram of an encoder, in accordance with some embodiments of the present disclosure.

Some embodiments of the present disclosure provide an encoder. As shown in FIG. 12, the encoder 400 includes an interface circuit 402 configured to obtain a data signal, and the data signal includes a plurality of information bits 201.

For example, the encoder 400 includes an interface circuit 402 configured to receive a data signal, and the data signal includes a plurality of information bits 201.

For another example, the encoder 400 includes an interface circuit 402 configured to generate a data signal, and the data signal includes a plurality of information bits 201.

The encoder 400 further includes a processor 403 coupled to the interface circuit 402. The processor 403 is configured to perform an encoding process on the data signal to obtain an encoded signal. The processor 403 may be a digital signal processing (DSP), application-specific integrated circuit (ASIC), field-programmable gate array (FPGA), neural network processing unit (NPU), artificial intelligent chip, data processing unit (DPU), or the like.

In some embodiments, the encoder may be a chip or a chip system. For example, the encoder is a chip system, and the chip system may include a chip, or may include a chip and other discrete devices.

As shown in FIGS. 7A to 10B, the encoded signal 300 includes at least one encoding block 301. The encoded bits within the encoding block 301 are arranged in a rectangular structure, and the encoding block 301 includes a first encoding sub-block 302 and at least one second encoding sub-block 303.

The first encoding sub-block 302 includes a plurality of first component codewords 3021 and a plurality of second component codewords 3022. A first component codeword 3021 and a second component codeword 3022 both include one or more information bits 201 of the plurality of information bits 201 and one or more check bits 401. All information bits 201 in the plurality of first component codewords 3021 and the plurality of second component codewords 3022 constitute an information bit matrix 202. The information bit matrix 202 may have a same side length, or different side lengths. For example, the information bit matrix 202 may have S rows and S columns. S is the information bit length of the first component codewords 3021 or the information bit length of the second component codewords 3022, and is a positive integer greater than 1.

The one or more check bits 401 within the first component codeword 3021 are determined by the information bits 201 within the first component codeword 3021. The one or more check bits 402 within the second component codewords 3022 are determined by the information bits 201 within the second component codeword 3021.

Each second encoding sub-block 303 includes a first check matrix 304. The first check matrix 304 includes a plurality of first check bit sets 3041 each including one or more check bits. The first check bit set 3041 is determined based on some bits of a first bit matrix with same side lengths, and the first check bit set 3041 and the bits constitute a third component codeword 3042. The first bit matrix includes any one of: part or of all information bits of the plurality of information bits, part or all of check bits in the plurality of first component codewords, or part or all of check bits in the plurality of second component codewords.

In some embodiments, the bits are located in different rows and different columns of the first bit matrix. That is, any two bits from the first bit matrix in the same third component codeword 3042 are located in different rows and different columns of the first bit matrix.

In some embodiments, as shown in FIGS. 7A, 7B, 8A and 8B, the encoding block 301 includes the first encoding sub-block 302 and one second encoding sub-block 303. In some other embodiments, as shown in FIGS. 9A, 9B, 10A and 10B, the encoding block 301 includes the first encoding sub-block 302 and a plurality of second encoding sub-blocks 303, and the plurality of second coding sub-blocks 303 are different.

In some embodiments, the first encoding sub-block 302 includes a two-dimensional product code. The two-dimensional product code includes a plurality of first component codewords 3021 and a plurality of second component codewords 3022, a first component codeword 3021 and a second component codeword 3022 both include one or more information bits 201 of the plurality of information bits 201 and one or more check bits 401, and all information bits 201 in the plurality of first component codewords 3021 and the plurality of second component codewords 3022 constitute an information bit matrix 202. The information bit matrix 202 may have a same side length, or different side lengths. For example, the information matrix 202 may have S rows and S columns. S is the information bit length of the first component codewords 3021 or the information bit length of the second component codewords 3022, and is a positive integer greater than 1.

In the first encoding sub-block 302, since all the information bits 201 in the plurality of first component codewords 3021 and the plurality of second component codewords 3022 constitute the S×S information bit matrix 202, any information bit 201 in the information bit matrix 202 belongs to both a first component codeword 3021 and a second component codeword 3022. The number of information bits 201 in the first component codeword 3021 is equal to the number of information bits 201 in the second component codeword 3022.

In some embodiments, the first encoding sub-block 302 may have the same side lengths, and the side length of the first bit matrix may be less than or equal to the side length of the first encoding sub-block 302. For example, the first bit matrix may be the information bit matrix 202, the first encoding sub-block 302, or any matrix with the same side lengths which are less than the side length of the first encoding sub-block 302.

In some embodiments, the first encoding sub-block 302 may have different side lengths, and the side length of the first bit matrix may be less than or equal to the minimum side length of the first encoding sub-block 302. For example, the first bit matrix may be the information bit matrix 202, or any matrix with the different side lengths which are less than the minimum side length of the first encoding sub-block 302.

In this way, the side length of the first bit matrix may be determined according to the actual bits to be protected, thus realizing on-demand protection. That is, the unnecessary check bits may be reduced, thereby reducing the decoding memory, power consumption and delay.

In each second encoding sub-block 303, each first check bit set 3041 corresponds to one third component codeword 3042. For example, the first bit matrix may be the information bit matrix 202, and each second encoding sub-block 303 includes a first check matrix 304; the first check matrix 304 includes a plurality of first check bit sets 3041 each including one or more check bits, the first check bit set 3041 is determined based on one or more information bits 201 of the information bit matrix 202, and the first check bit set 3041 and the information bits 201 used for determining the first check bit set 3041 constitute a third component codeword 3042. Information bits 201 in any third component codeword 3042 are located in different rows and different columns of the information bit matrix 202. That is, any two information bits 201 in the same third component codeword 3042 are located in different rows and different columns of the information bit matrix 202.

For any third component codeword 3042, when the first bit matrix is the information bit matrix 202, the information bits 201 of the third component codeword 3042 are located in different rows and different columns of the information bit matrix 202. That is, any two different information bits 201 in the same third component codeword 3042 are located in different rows and different columns of the information bit matrix 202. For convenience, coordinates of one or more information bits 201 located in different rows and different columns of the information bit matrix 202 are converted into coordinates in the same column or in the same row, as the coordinates of the information bits 201 of the third component codeword 3042.

Accordingly, for any third component codeword 3042, when the first bit matrix is the first encoding sub-block 302, the bits for determining the first check bit set 3041 in the third component codeword 3042 are located in different rows and different columns of the first encoding sub-block 302. That is, any two different bits of the bits for determining the first check bit set 3041 in the same third component codeword 3042 are located in different rows and different columns of the first encoding sub-block 302. For convenience, coordinates of some bits located in different rows and different columns of the first encoding sub-block 302 are converted into coordinates in the same column or in the same row, as the coordinates of the bits in the third component codeword 3042.

Accordingly, for any third component codeword 3042, when the first bit matrix is any matrix with the same side lengths which may be less than the side length or minimum side length of the first encoding sub-block 302, the bits for determining the first check bit set 3041 in the third component codeword 3042 are located in different rows and different columns of the first bit matrix. That is, any two different bit of the bits for determining the first check bit set 3041 in the same third component codeword 3042 are located in different rows and different columns of the first bit matrix. For convenience, coordinates of some bits located in different rows and different columns of the first bit matrix are converted into coordinates in the same column or in the same row, as the coordinates of the bits in the third component codeword 3042.

In some embodiments, no two bits in the first bit matrix share the same two third component codewords.

For example, as shown in FIGS. 5A, 5B, 7A and 8A, when the first bit matrix is the information bit matrix 202, no two information bits 201 in the same row or column of information bit matrix 202 share the same third component codeword. That is, any two information bits 201 in the third component codeword 3042 cannot be located in the same row or column of the information bit matrix 202. Thus, the information bit 201 has scattering property, and the information bit 201 has strong protection. In these embodiments, two different information bits 201 of the information bit matrix 202 cannot be protected by the same two third component codewords 3042, so that the information bit 201 in the information bit matrix 202 may be protected without redundancy protection.

Accordingly, as shown in FIGS. 5A, 5B, 7B and 8B, when the first bit matrix is the first encoding sub-block 302, no two bits in the first encoding sub-block 302 share the same two component codewords. That is, any two bits from the first encoding sub-block 302 in the third component codeword 3042 cannot be located in the same row or column of the first encoding sub-block 302. Thus, the bit from the first encoding sub-block 302 has scattering property, and the bit from the first encoding sub-block 302 has strong protection. In these embodiments, two different bits 201 of the first bit matrix cannot be protected by the same two third component codeword 3042, so that the bit in the first bit matrix may be protected without redundancy protection.

Accordingly, when the first bit matrix may be any matrix with the same side lengths which may be less than the side length or minimum side length of the first encoding sub-block 302, no two bits in the first bit matrix share the same two component codewords. That is, any two bits from the first bit matrix included in the third component codeword 3042 cannot be located in the same row or column of the first bit matrix. Thus, the bit from the first bit matrix has scattering property, and the bit from the first bit matrix has strong protection. In these embodiments, two different bits of the first bit matrix cannot be protected by the same two third component codeword 3042, so that the bit in the first bit matrix may be protected without redundancy protection.

In some embodiments, the bits from the first bit matrix included in any two third component codewords are in different positions of the first bit matrix.

For example, in each second encoding sub-block 303, when the first bit matrix is the information bit matrix 202, the information bits 201 included in any two third component codewords 3042 are in different positions of the information bit matrix 202. That is, for an information bit 201 of any third component codeword 3042 for each second encoding sub-block 303, it does not belong to any one of the remaining third component codewords 3042. In these embodiments, the information bit 201 in the information bit matrix 202 may be protected without redundancy protection.

Accordingly, when the first bit matrix is the first encoding sub-block 302, the bits from the first encoding sub-block 302 included in any two third component codewords 3042 are in different positions of the first encoding sub-block 302. That is, for a bit from the first encoding sub-block 302 included in any third component codeword 3042 for each second encoding sub-block 303, it does not belong to any one of the remaining third component codewords 3042. In these embodiments, the bit in the first encoding sub-block 302 may be protected without redundancy protection.

Accordingly, when the first bit matrix is any matrix with the same side lengths which are less than the side length or minimum side length of the first encoding sub-block 302, the bits from the first bit matrix included in any two third component codewords 3042 are in different positions of the first bit matrix. That is, for a bit from the first bit matrix included in any third component codeword 3042 for each second encoding sub-block 303, it does not belong to any one of the remaining third component codewords 3042. In these embodiments, the bit in the first bit matrix may be protected without redundancy protection.

In some embodiments, the bits for determining the first check bit set 3041 in the third component codeword are bits in a row or column selected from a second bit matrix, and the second bit matrix is determined based on the first bit matrix and an invertible transformation matrix. The invertible transformation matrix may be an invertible matrix descripted above. Thus, the calculation process of determining the first check bit set based on the second bit matrix may be simplified.

In some embodiments, the bits in different third component codeword are bits in a row or column selected from the same or different second bit matrix.

In some embodiments, the bits in different third component codewords may be bits from different second encoding sub-blocks, or may be bits from the same second encoding sub-block. For example, the bits in some third component codewords may be bits from a second encoding sub-block 302, and the bits in some other third component codewords may be bits from another second encoding sub-block 302.

Based on the above description, for at least part of information bits 201 in the information bit matrix 202, the information bit 201 belongs to at least three component codewords, which are the first component codeword 3021 and the second component codeword 3022 in the first encoding sub-block 302 and the third component codeword 3042 in each second encoding sub-block 303. Therefore, the at least part of the information bits 201 is protected by at least three component codewords. That is, the bit degree of each information bit 201 of the at least part of the information bits 201 is at least 3. Since the bit degree of the at least part of the information bits 201 in the information bit matrix 202 is greater than 2, the relatively weak component codeword is allowed to be used (that is, the number of check bits of the component codeword can be relatively small).

In some embodiments, for each information bit 201 in the information bit matrix 202, the information bit 201 belongs to at least three component codewords, which are the first component codeword 3021 and the second component codeword 3022 in the first encoding sub-block 302 and the third component codeword 3042 in each second encoding sub-block 303. Therefore, the information bit 201 is protected by at least three component codewords. That is, the bit degree of the information bit 201 is at least 3. Since the bit degree of each information bit 201 in the information bit matrix 202 is greater than 2, the relatively weak component codeword is allowed to be used (i.e., the number of check bits of the component codeword can be relatively small).

In some embodiments, the first component codeword 3021 includes a check bit of a first encoding, the second component codeword 3022 includes a check bit of a second encoding, the third component codeword 3042 includes a check bit of a third encoding. The first encoding, the second encoding and the third encoding each are one of a Hamming code, a 2-error-correcting BCH code, or a 3-error-correcting BCH code.

In the encoder provided in the embodiments of the present disclosure, a second encoding sub-block is added to the encoding block to extend protection for at least part of the information parts, since the at least part of the information bit is protected by more than two component codewords in the two-dimensional space (that is, the bit degree of the at least part of the information bit is greater than 2), the number of check bits in the component codeword is allowed to be relatively small, and compared with the three-dimensional product code, decoding memory is small (less than 1.8 Mbits), and power consumption and delay are low; and the decoding buffer size is realistic for implementation in optical communication, for example, the encoder can be applicable to the 1.6T ZR standard. In addition, since the encoded signal has the block code structure in the two-dimensional space, the encoder is suitable for applications that adopt the block code.

In some embodiments, as shown in FIGS. 6 to 8B, the two-dimensional product code consists of the information bit matrix 202, a row check matrix 203, a column check matrix 204 and a double check matrix 205. The row check matrix 203 and the information bit matrix 202 are in a same row but in different columns, and the column check matrix 204 and the information bit matrix 202 are in a same column but in different rows. The row check matrix 203 and the column check matrix 204 are used to correct errors in the information bit matrix 202. The double check matrix 205 is used to correct errors in the row check matrix 203 and the column check matrix 204.

In a region where the row check matrix 203 and the double check matrix 205 are located, check bits of each column constitute a column codeword (the column codeword is also a component codeword); and in a region where the column check matrix 204 and the double check matrix 205 are located, check bits of each row constitute a row codeword (the row codeword is also a component codeword). Thus, for the check bit in the row check matrix 203, the check bit is constrained by the first component codeword 3021 and the column codeword, and the bit degree of the check bit in the row check matrix 203 is 2. For the check bit in the column check matrix 204, the check bit is constrained by the second component codeword 3022 and the row codeword, and the bit degree of the check bit in the column check matrix 204 is 2. For the check bit in the double check matrix 205, the check bit is constrained by the row codeword and the column codeword, and the bit degree of the check bit in the double check matrix 205 is also 2.

In this way, in the first and second dimensions, since the bit degree of each check bit is 2, it is not easy to encounter the issue of miss correction or not able to correct errors. Thus, the reliability of data transmission is high.

In some embodiments, as shown in FIGS. 7A, 7B, 8A and 8B, the second encoding sub-block 303 further includes a second check matrix 305. The second check matrix 305 is used to correct errors in check bits of the first check matrix 304. The check bits in the second check matrix 305 are determined based on the check bits in the first check matrix 304 to correct errors in the check bits of the first check matrix 304. In this way, through the second check matrix 305, the encoded signal encoded by the encoding method provided in the embodiments of the present disclosure has multiple error verifications, so that the reliability of data transmission can be further improved.

In some embodiments, as shown in FIGS. 7A and 7B, the at least one second encoding sub-block 303 and the first encoding sub-block 302 are in the same column but in different rows, and the first check matrix 304 and the second check matrix 305 are in the same row but in different columns. The second check matrix 305 includes a plurality of second check bit sets 3051 each including one or more check bits, and the second check bit set 3051 is determined based on a row of check bits in the first check matrix 304, and check bits in the row of check bits are located in the plurality of first check bit sets 3041 of the first check matrix 304.

In some embodiments, as shown in FIGS. 8A and 8B, the at least one second encoding sub-block 303 and the first encoding sub-block 302 are in the same row but in different columns, and the first check matrix 304 and the second check matrix 305 are in the same column but in different rows. The second check matrix 305 includes a plurality of second check bit sets 3051 each including one or more check bits, and the second check bit set 3051 is determined based on a column of check bits in the first check matrix 304, and check bits in the column of check bits are located in the plurality of first check bit sets 3041 of the first check matrix 304.

In some embodiments, as shown in FIGS. 9A, 9B, 10A and 10B, the at least one second encoding sub-block 303 includes a plurality of second encoding sub-blocks 303, and the plurality of second encoding sub-blocks 303 are located on the same side or on opposite sides of the first encoding sub-block 302.

By arranging the plurality of second encoding sub-blocks 303, the encoding block 301 has dimensions greater than 3, and the bit degree of the information bit 201 is also greater than 3. Therefore, the error correction capability of the encoding block 301 may be higher.

It should be noted that, for the encoder 400, reference can be made to the description of the encoding method described above, and it will not be repeated here.

In some embodiments, the encoder may be a chip or a chip system. For example, the encoder may be a chip system, and it may include a chip, or may include a chip and other discrete devices.

Some embodiments of the present disclosure provide a data transmission system, and referring to FIG. 2, the system includes a transmitter 101 and a receiver 103. The transmitter 101 includes an encoder, which is the encoder 400 described above. The transmitter 101 may be configured to transmit the encoded signal. The receiver 103 is coupled to the transmitter 101. The receiver 103 includes a decoder, and the receiver is configured to receive the encoded signal and use the decoder 400 to decode the encoded signal.

For example, the receiver 103 may be configured to receive the encoded signal from the transmitter 101 and use the decoder 400 to decode each encoding block of the encoded signal in parallel. That is, the decoder 400 may be configured to decode each encoding block of the encoded signal in parallel.

In the case where the data transmission system is applied to a fiber-optic communication system, the system further includes a fiber-optic link coupled between the transmitter 101 and the receiver 103, and the encoded signal generated by the encoder 400 is transmitted to the decoder through the fiber-optic link.

In addition, the data transmission system is also applied to storage, free-space optical communication and wireless communication system.

In some embodiments, the decoder is a hard decoder or soft decoder. For example, the encoder 400 is paired with the hard decoder, and used as outer code in CFEC (e.g., replacing the staircase code in CFEC). For another example, the encoder 400 is paired with the soft decoder, and used as a stand-alone FEC.

The soft FEC is a FEC design that utilizes the reliability of each received bit, i.e., the log-likelihood-ratio (LLR) or the soft-information, in the decoding process. The hard FEC is a FEC design whose decoder does not access to the soft-information. The log-likelihood-ratio (LLR) of a bit b is defined as $$LLR(b) = \log\frac{p(b = 0 \mid Y = y)}{p(b = 1 \mid Y = y)},$$

where Y is the received symbol.

In some embodiments, the system may further include at least one buffer coupled to the decoder, which is used to store at least one encoding block of the encoded signal.

It should be noted that the buffer may also be integrated into the receiver 103.

Some embodiments of the present disclosure provide a computer-readable storage medium (e.g., a non-transitory computer-readable storage medium), and the computer-readable storage medium stores therein instructions that, when run on a computer, cause the computer to execute the encoding method in any of the above embodiments.

For example, the computer-readable storage medium may include, but is not limited to, a magnetic storage device (e.g., a hard disk, a floppy disk or a magnetic tape), an optical disk (e.g., a compact disk, a digital versatile disk (DVD)), a smart card, a flash memory device (e.g., an erasable programmable read-only memory (EPROM), a card, a stick or a key driver). Various computer-readable storage medium described in the embodiments of the present disclosure may represent one or more devices and/or other machine-readable storage medium for storing information. The term "machine-readable storage medium" may include, but is not limited to, wireless channels and various other medium capable of storing, containing and/or carrying instructions and/or data.

Some embodiments of the present disclosure further provide a computer program product. For example, the computer program product is stored on non-transitory computer-readable storage medium. The computer program product includes computer program instructions that, when executed on a computer, cause the computer to perform the encoding method in any of the above embodiments.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

The invention claimed is:

1. A method, comprising:

obtaining a data signal, the data signal including a plurality of information bits; and performing an encoding process on the data signal to obtain an encoded signal, wherein;

the encoded signal includes at least one encoding block, and an encoding block includes a first encoding sub-block and at least one second encoding sub-block;

the first encoding sub-block includes a plurality of first component codewords and a plurality of second component codewords, a first component codeword and a second component codeword both include one or more information bits of the plurality of information bits and one or more check bits, and all information bits in the plurality of first component codewords and the plurality of second component codewords constitute an information bit matrix; and each second encoding sub-block includes a first check matrix; the first check matrix includes a plurality of first check bit sets each including one or more check bits, a first check bit set is determined based on bits of a first bit matrix with same side lengths, and the first check bit set and the bits of the first bit matrix constitute a third component codeword; and wherein the first bit matrix includes any one of: part or all of information bits of the plurality of information bits, part or all of check bits in the plurality of first component codewords, or part or all of check bits in the plurality of second component codewords.

2. The method according to claim 1, wherein no two bits in the first bit matrix share same two third component codewords.

3. The method according to claim 1, wherein the first encoding sub-block has same side lengths, and a side length of the first bit matrix is less than or equal to a side length of the first encoding sub-block; or the first encoding sub-block has different side lengths, and a side length of the first bit matrix is less than or equal to a minimum side length of the first encoding sub-block.

4. The method according to claim 1, wherein the third component codeword includes bits in a row or column selected from a second bit matrix, and the second bit matrix is determined based on the first bit matrix and an invertible transformation matrix; and bits in different third component codewords are bits in a row or column selected from different second bit matrices.

5. The method according to claim 1, wherein the second encoding sub-block further includes a second check matrix, and the second check matrix is used to correct errors in check bits of the first check matrix.

6. The method according to claim 5, wherein the second check matrix includes a plurality of second check bit sets, each second check bit set includes one or more check bits, and the second check bit set is determined based on a plurality of check bits of the first check matrix.

7. The method according to claim 6, wherein the at least one second encoding sub-block and the first encoding sub-block are in a same column but in different rows, and the first check matrix and the second check matrix are in a same row but in different columns; and the second check matrix includes the plurality of second check bit sets each including one or more check bits, and the second check bit set is determined based on a row of check bits in the first check matrix, and check bits in the row of check bits are located in the plurality of first check bit sets.

8. The method according to claim 7, wherein the at least one second encoding sub-block includes a plurality of second encoding sub-blocks, and the plurality of second encoding sub-blocks are located on a same side or on opposite sides of the first encoding sub-block.

9. The method according to claim 6, wherein the at least one second encoding sub-block and the first encoding sub-block are in a same row but in different columns, and the first check matrix and the second check matrix are in a same column but in different rows; and the second check matrix includes the plurality of second check bit sets each including one or more check bits, and the second check bit set is determined based on a column of check bits in the first check matrix, and check bits in the column of check bits are located in the plurality of first check bit sets.

10. An encoder, comprising:

an interface circuit configured to obtain a data signal, the data signal including a plurality of information bits; and a processor configured to perform an encoding process on the data signal to obtain an encoded signal, wherein:

the encoded signal includes at least one encoding block, and an encoding block includes a first encoding sub-block and at least one second encoding sub-block;

the first encoding sub-block includes a plurality of first component codewords and a plurality of second component codewords; a first component codeword and a second component codeword both include one or more information bits of the plurality of information bits and one or more check bits, and all information bits in the plurality of first component codewords and the plurality of second component codewords constitute an information bit matrix; and each second encoding sub-block includes a first check matrix; the first check matrix includes a plurality of first check bit sets each including one or more check bits, a first check bit set is determined based on bits of a first bit matrix with same side lengths, and the first check bit set and the bits of the first bit matrix constitute a third component codeword; and wherein the first bit matrix includes any one of: part or all of information bits of the plurality of information bits, part or all of check bits in the plurality of first component codewords, or part or all of check bits in the plurality of second component codewords.

11. The encoder according to claim 10, wherein no two bits in the first bit matrix share same two third component codewords.

12. The encoder according to claim 10, wherein the first encoding sub-block has same side lengths, and a side length of the first bit matrix is less than or equal to a side length of the first encoding sub-block; or the first encoding sub-block has different side lengths, and a side length of the first bit matrix is less than or equal to a minimum side length of the first encoding sub-block.

13. The encoder according to claim 10, wherein the third component codeword includes bits in a row or column selected from a second bit matrix, and the second bit matrix is determined based on the first bit matrix and an invertible transformation matrix; and bits in different third component codewords are bits in a row or column selected from different second bit matrices.

14. The encoder according to claim 10, wherein the second encoding sub-block further includes a second check matrix, and the second check matrix is used to correct errors in check bits of the first check matrix.

15. The encoder according to claim 14, wherein the second check matrix includes a plurality of second check bit sets, each second check bit set includes one or more check bits, and the second check bit set is determined based on a plurality of check bits of the first check matrix.

16. The encoder according to claim 15, wherein the at least one second encoding sub-block and the first encoding sub-block are in a same column but in different rows, and the first check matrix and the second check matrix are in a same row but in different columns; and the second check matrix includes the plurality of second check bit sets each including one or more check bits, the second check bit set is determined based on a row of check bits in the first check matrix, and check bits in the row of check bits are located in the plurality of first check bit sets; or the at least one second encoding sub-block and the first encoding sub-block are in a same row but in different columns, and the first check matrix and the second check matrix are in a same column but in different rows; and the second check matrix includes the plurality of second check bit sets each including one or more check bits, and the second check bit set is determined based on a column of check bits in the first check matrix, and check bits in the column of check bits are located in the plurality of first check bit sets.

17. The encoder according to claim 16, wherein the at least one second encoding sub-block includes a plurality of second encoding sub-blocks, and the plurality of second encoding sub-blocks are located on a same side or on opposite sides of the first encoding sub-block.

18. A data transmission system, comprising:

a transmitter including an encoder, the encoder comprising:

an interface circuit configured to obtain a data signal, the data signal including a plurality of information bits; and a processor configured to perform an encoding process on the data signal to obtain an encoded signal, wherein:

the encoded signal includes at least one encoding block, and an encoding block includes a first encoding sub-block and at least one second encoding sub-block;

the first encoding sub-block includes a plurality of first component codewords and a plurality of second component codewords; a first component codeword and a second component codeword both include one or more information bits of the plurality of information bits and one or more check bits, and all information bits in the plurality of first component codewords and the plurality of second component codewords constitute an information bit matrix; and each second encoding sub-block includes a first check matrix; the first check matrix includes a plurality of first check bit sets each including one or more check bits, a first check bit set is determined based on bits of a first bit matrix with same side lengths, and the first check bit set and the bits of the first bit matrix constitute a third component codeword; and wherein the first bit matrix includes any one of: part or all of information bits of the plurality of information bits, part or all of check bits in the plurality of first component codewords, or part or all of check bits in the plurality of second component codewords;

the transmitter being configured to transmit the encoded signal; and a receiver coupled to the transmitter and including a decoder, the receiver being configured to receive the encoded signal and use the decoder to decode the encoded signal.

19. The data transmission system according to claim 18, wherein the decoder is a hard decoder or soft decoder.

20. A non-transitory computer-readable storage medium storing instructions that, when executed by a computer, causes the computer to perform operations including:

obtaining a data signal, the data signal including a plurality of information bits; and performing an encoding process on the data signal to obtain an encoded signal, wherein:

the encoded signal includes at least one encoding block, and an encoding block includes a first encoding sub-block and at least one second encoding sub-block;

the first encoding sub-block includes a plurality of first component codewords and a plurality of second component codewords, a first component codeword and a second component codeword both include one or more information bits of the plurality of information bits and one or more check bits, and all information bits in the plurality of first component codewords and the plurality of second component codewords constitute an information bit matrix; and each second encoding sub-block includes a first check matrix; the first check matrix includes a plurality of first check bit sets each including one or more check bits, a first check bit set is determined based on bits of a first bit matrix with same side lengths, and the first check bit set and the bits of the first bit matrix constitute a third component codeword; and wherein the first bit matrix includes any one of: part or all of information bits of the plurality of information bits, part or all of check bits in the plurality of first component codewords, or part or all of check bits in the plurality of second component codewords.

* * * * *